United States Patent
Kim et al.

(10) Patent No.: US 8,399,333 B2
(45) Date of Patent: Mar. 19, 2013

(54) INSULATOR LAYER BASED MEMS DEVICES

(75) Inventors: Sangchae Kim, Irvine, CA (US); Tony Ivanov, Summerfield, NC (US); Julio Costa, Oak Ridge, NC (US)

(73) Assignee: RF Micro Devices, Inc., Greensboro, NC (US)

( * ) Notice: Subject to any disclaimer, the term of this patent is extended or adjusted under 35 U.S.C. 154(b) by 97 days.

(21) Appl. No.: 13/097,989

(22) Filed: Apr. 29, 2011

(65) Prior Publication Data

US 2011/0204478 A1 Aug. 25, 2011

Related U.S. Application Data

(63) Continuation of application No. 12/181,356, filed on Jul. 29, 2008, now Pat. No. 7,956,429.

(60) Provisional application No. 60/953,617, filed on Aug. 2, 2007.

(51) Int. Cl.
*H01L 21/20* (2006.01)
*H01L 21/02* (2006.01)

(52) U.S. Cl. .................. 438/396; 438/381; 257/532

(58) Field of Classification Search .................. 438/381, 438/396–399; 257/532–535; 361/301.1
See application file for complete search history.

(56) References Cited

U.S. PATENT DOCUMENTS

| | | | |
|---|---|---|---|
| 6,054,659 A | 4/2000 | Lee et al. | |
| 6,396,368 B1 | 5/2002 | Chow et al. | |
| 6,611,033 B2 * | 8/2003 | Hsu et al. | 257/414 |
| 6,635,919 B1 | 10/2003 | Melendez et al. | |
| 7,443,693 B2 | 10/2008 | Arnold et al. | |
| 7,471,176 B2 | 12/2008 | Bunyan et al. | |
| 7,635,918 B2 | 12/2009 | Yoshida | |
| 7,709,285 B2 | 5/2010 | Van Beek et al. | |
| 2004/0214543 A1 | 10/2004 | Osone et al. | |
| 2005/0153061 A1 | 7/2005 | Nuytkens et al. | |
| 2006/0208823 A1 | 9/2006 | Hunt et al. | |
| 2006/0226735 A1 | 10/2006 | Ikehashi | |
| 2006/0270238 A1 | 11/2006 | Izumi et al. | |
| 2008/0090320 A1 | 4/2008 | Heck | |

FOREIGN PATENT DOCUMENTS

| | | |
|---|---|---|
| JP | 2007-311396 A | 11/2007 |
| WO | WO03105174 A1 * | 12/2003 |
| WO | WO 2005043573 A2 * | 5/2005 |
| WO | 2007132560 A | 11/2007 |

OTHER PUBLICATIONS

Notice of Allowance mailed Jan. 31, 2011 regarding U.S. Appl. No. 12/181,356, now U.S. Patent No. 7,956,429.
Final Office Action mailed Oct. 13, 2010 regarding U.S. Appl. No. 12/181,356, now U.S. Patent No. 7,956,429.

(Continued)

*Primary Examiner* — Fernando L Toledo
*Assistant Examiner* — Bryan Junge
(74) *Attorney, Agent, or Firm* — Withrow & Terranova, P.L.L.C.

(57) ABSTRACT

The present invention relates to using an insulator layer between two metal layers of a semiconductor die to provide a micro-electromechanical systems (MEMS) device, such as an ohmic MEMS switch or a capacitive MEMS switch. In an ohmic MEMS switch, the insulator layer may be used to reduce metal undercutting during fabrication, to prevent electrical shorting of a MEMS actuator to a MEMS cantilever, or both. In a capacitive MEMS switch, the insulator layer may be used as a capacitive dielectric between capacitive plates, which are provided by the two metal layers. A fixed capacitive element may be provided by the insulator layer between the two metal layers. In one embodiment of the present invention, an ohmic MEMS switch, a capacitive MEMS switch, a fixed capacitive element, or any combination thereof may be integrated into a single semiconductor die.

23 Claims, 38 Drawing Sheets

OTHER PUBLICATIONS

Nonfinal Office action mailed Apr. 28, 2010 regarding U.S. Appl. No. 12/181,356, now U.S. Patent No. 7,956,429.

Requirement for Restriction/Election mailed Feb. 17, 2010 regarding U.S. Appl. No. 12/181,356, now U.S. Patent No. 7,956,429.

\* cited by examiner

INSULATOR LAYER BASED MEMS DEVICES

RELATED APPLICATIONS

This application is a continuation of U.S. patent application Ser. No. 12/181,356, filed Jul. 29, 2008, now U.S. Pat. No. 7,956,429, the disclosure of which is incorporated herein by reference in its entirety.

FIELD OF THE DISCLOSURE

Embodiments of the present invention relate to micro-electromechanical systems (MEMS) devices integrated into a semiconductor die. The MEMS devices may be used in tunable or adaptive circuits.

BACKGROUND

As technology progresses, geometries of integrated circuits become smaller and smaller. Increasing varieties and quantities of circuit elements are integrated into semiconductor dies to reduce sizes and costs of electronics equipment. Tuning and adaptive circuits are two types of circuits commonly used in electronics circuits. An example of a tuning circuit is a digitally-controlled oscillator (DCO) used in a frequency synthesizer. The DCO may use a resonant circuit having an inductance and a capacitance to establish an oscillator frequency for the DCO. The capacitance may be provided by a selectable capacitor bank 10 as illustrated in FIG. 1, according to the prior art.

The selectable capacitor bank 10 includes a first capacitive element C1, a second capacitive element C2, up to and including an Nth capacitive element CN, a first switch 12, a second switch 14, up to and including an Nth switch 16, and control circuitry 18. Each of the capacitive elements C1, C2, CN is coupled in series with each of the switches 12, 14, 16, respectively, and each capacitive element and switch series coupling is coupled between a first terminal FT and a second terminal ST. A control terminal of each of the switches 12, 14, 16 is coupled to and controlled by the control circuitry 18, which receives control information via a control interface CONT. The frequency of the DCO is tuned by controlling the capacitance of the selectable capacitor bank 10, based on the control information, by selecting the appropriate combination of capacitive elements C1, C2, CN to provide the desired capacitance. Thus, there is a need to integrate capacitive elements C1, C2, CN and switches 12, 14, 16 into a common semiconductor die.

Micro-electromechanical systems (MEMS) devices, such as MEMS switches, are often integrated into semiconductor dies. However, as geometries of integrated circuits become smaller and smaller, fabrication of MEMS devices may become increasingly problematic. FIG. 2 shows a MEMS switch 20, according to the prior art. The MEMS switch 20 includes a cantilever 22 having a movable contact 24, a fixed contact 26 electrically coupled to a first terminal 28, a second terminal 30 electrically coupled to the movable contact 24, and an actuator 32 electrically coupled to a control terminal 34. When the MEMS switch 20 is actuated by applying an actuation signal to the control terminal 34, the movable and fixed contacts 24, 26 come together, thereby closing the MEMS switch 20. When the MEMS switch 20 is closed, the touching movable and fixed contacts 24, 26 have some contact resistance; therefore, the MEMS switch 20 is called an ohmic MEMS switch. When the MEMS switch 20 is not actuated by removing the actuation signal from the control terminal 34, the movable and fixed contacts 24, 26 move apart, thereby opening the MEMS switch 20.

During actuation, if the geometries of the MEMS switch 20 are sufficiently small, there may be a risk of the cantilever 22 shorting to the actuator 32. Additionally, the actuator 32 may be formed using a first metal layer (not shown) and the cantilever 22 may be formed using a second metal layer (not shown). Therefore, when the second metal layer is etched to form the cantilever 22, the metal actuator 32 may be undercut. Thus, there is a need to prevent cantilever 22 to actuator 32 shorting and to prevent metal undercutting of the actuator 32 in a MEMS switch 20.

SUMMARY

The present invention relates to using an insulator layer between two metal layers of a semiconductor die to provide a micro-electromechanical systems (MEMS) device, such as an ohmic MEMS switch or a capacitive MEMS switch. In an ohmic MEMS switch, the insulator layer may be used to reduce metal undercutting during fabrication, to prevent electrical shorting of a MEMS actuator to a MEMS cantilever, or both. In a capacitive MEMS switch, the insulator layer may be used as a capacitive dielectric between capacitive plates, which are provided by the two metal layers.

A fixed capacitive element may be provided by the insulator layer sandwiched between the two metal layers. In one embodiment of the present invention, an ohmic MEMS switch, a capacitive MEMS switch, a fixed capacitive element, or any combination thereof may be integrated into a single semiconductor die. Combined switching elements and capacitive elements may be used in tunable or adaptive circuits, such as adaptive MEMS driver circuitry, frequency synthesizers, tunable radio frequency (RF) impedance matching circuits, or the like.

Those skilled in the art will appreciate the scope of the present invention and realize additional aspects thereof after reading the following detailed description of the preferred embodiments in association with the accompanying drawing figures.

Those skilled in the art will appreciate the scope of the disclosure and realize additional aspects thereof after reading the following detailed description in association with the accompanying drawings.

BRIEF DESCRIPTION OF THE DRAWINGS

The accompanying drawing figures incorporated in and forming a part of this specification illustrate several aspects of the invention, and together with the description serve to explain the principles of the invention.

DETAILED DESCRIPTION

The embodiments set forth below represent the necessary information to enable those skilled in the art to practice the invention and illustrate the best mode of practicing the invention. Upon reading the following description in light of the accompanying drawing figures, those skilled in the art will understand the concepts of the invention and will recognize applications of these concepts not particularly addressed herein. It should be understood that these concepts and applications fall within the scope of the disclosure and the accompanying claims.

The present invention relates to using an insulator layer between two metal layers of a semiconductor die to provide a micro-electromechanical systems (MEMS) device, such as an ohmic MEMS switch or a capacitive MEMS switch. In an ohmic MEMS switch, the insulator layer may be used to reduce metal undercutting during fabrication, to prevent electrical shorting of a MEMS actuator to a MEMS cantilever, or both. In a capacitive MEMS switch, the insulator layer may be used as a capacitive dielectric between capacitive plates, which are provided by the two metal layers.

A fixed capacitive element may be provided by the insulator layer between the two metal layers. In one embodiment of the present invention, an ohmic MEMS switch, a capacitive MEMS switch, a fixed capacitive element, or any combination thereof may be integrated into a single semiconductor die. Combined switching elements and capacitive elements may be used in tunable or adaptive circuits, such as adaptive MEMS driver circuitry, frequency synthesizers, tunable radio frequency (RF) impedance matching circuits, or the like.

Figure 1:
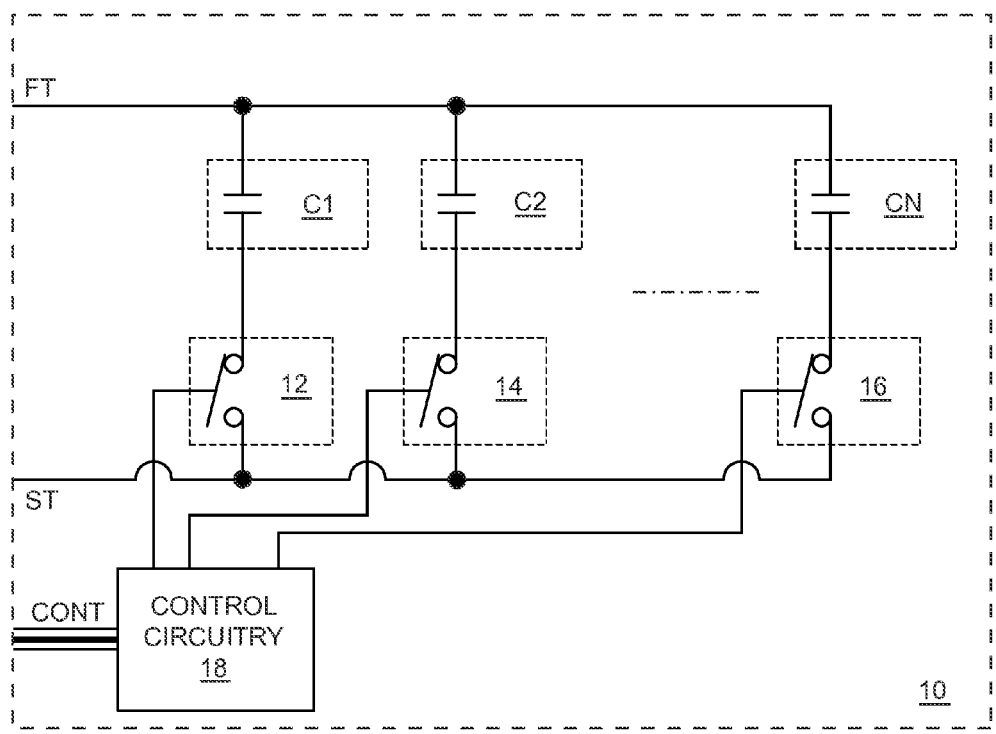
FIG. 1 shows a selectable capacitor bank, according to the prior art.
Figure 2:
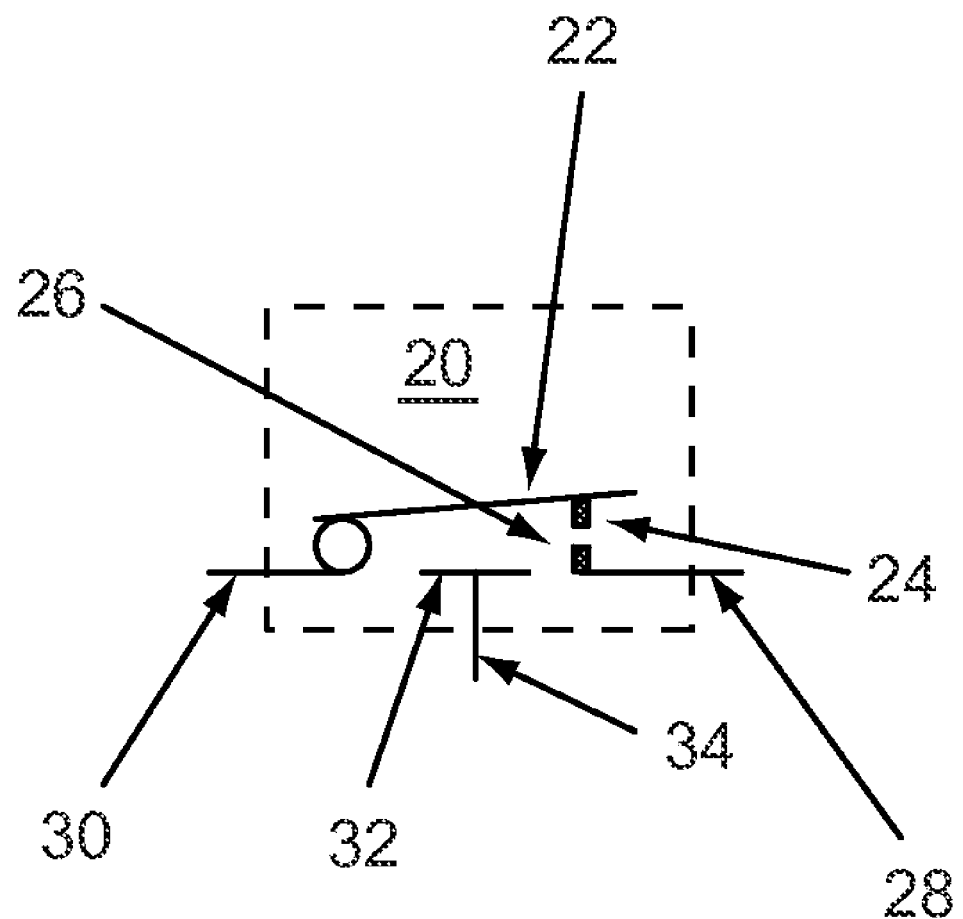
FIG. 2 shows a micro-electromechanical systems (MEMS) switch, according to the prior art.
Figure 3A:
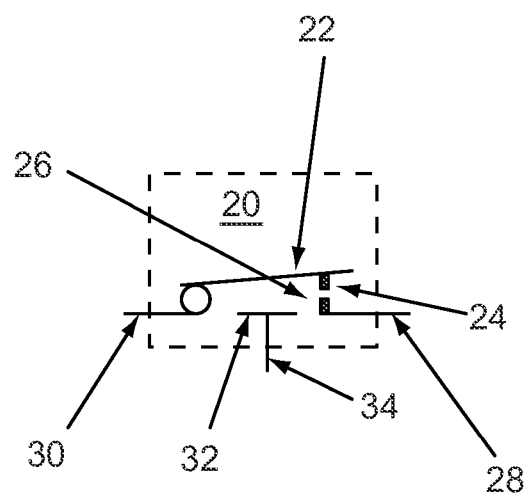
FIG. 3A shows the MEMS switch illustrated in FIG. 2
Figure 3B:
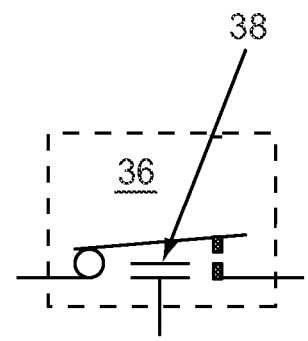
FIG. 3B shows a first insulated-actuator MEMS switch, according to one embodiment of the present invention.

FIG. 3A shows the MEMS switch 20 illustrated in FIG. 2 and FIG. 3B shows a first insulated-actuator MEMS switch 36, according to one embodiment of the present invention. The first insulated-actuator MEMS switch 36 is an ohmic MEMS switch similar to the MEMS switch 20 illustrated in FIG. 3A. However, the first insulated-actuator MEMS switch 36 includes an actuator insulator 38 over the actuator 32. The actuator insulator 38 may prevent shorting of the cantilever 22 to the actuator 32 when the first insulated-actuator MEMS switch 36 is actuated, may reduce or prevent metal undercutting of the actuator 32 during fabrication, or both.

Figure 4A:
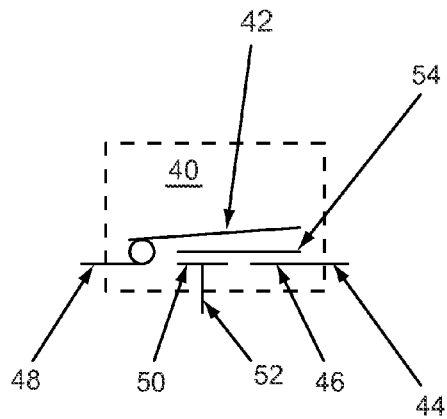
FIG. 4A shows a first MEMS switching capacitive element, according to an alternate embodiment of the present invention.

FIG. 4A shows a first MEMS switching capacitive element 40, according to an alternate embodiment of the present invention. The first MEMS switching capacitive element 40 includes a cantilever 42, which functions as a movable capacitive plate, a first terminal 44 electrically coupled to a fixed capacitive plate 46, a second terminal 48 electrically coupled to the cantilever 42, an actuator 50 electrically coupled to a control terminal 52, and a capacitive dielectric 54. The movable capacitive plate, the capacitive dielectric 54, and the fixed capacitive plate 46 form a selectable capacitive element.

When no actuation signal is applied to the control terminal 52, the first MEMS switching capacitive element 40 is not actuated. Therefore, non-actuated spacing between the movable capacitive plate and the fixed capacitive plate 46 establishes a first capacitance presented to the first and second terminals 44, 48. However, when an actuation signal is applied to the control terminal 52, the first MEMS switching capacitive element 40 is actuated, thereby moving the cantilever 42 closer to the fixed capacitive plate 46. Therefore, actuated spacing between the movable capacitive plate and the fixed capacitive plate 46 establishes a second capacitance presented to the first and second terminals 44, 48. The second capacitance is greater than the first capacitance due to the reduced spacing between the movable capacitive plate and the fixed capacitive plate 46.

The capacitive dielectric 54 insulates the cantilever 42 from the fixed capacitive plate 46. In one embodiment of the present invention, the capacitive dielectric 54 may prevent shorting of the cantilever 42 to the actuator 50 when the first MEMS switching capacitive element 40 is actuated, may reduce or prevent metal undercutting of the actuator 50 during fabrication, or both.

Figure 4B:
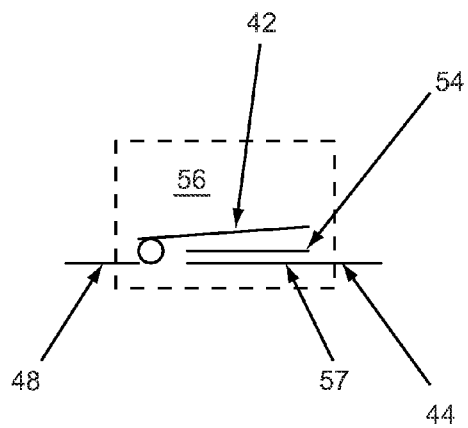
FIG. 4B shows an alternate MEMS switching capacitive element, according to another embodiment of the present invention.

FIG. 4B shows an alternate MEMS switching capacitive element 56, according to another embodiment of the present invention. The alternate MEMS switching capacitive element 56 includes the cantilever 42, which functions as a movable capacitive plate, the first terminal 44 electrically coupled to a combined actuator and fixed capacitive plate 57, the second terminal 48 electrically coupled to the cantilever 42, and the capacitive dielectric 54. The movable capacitive plate, the capacitive dielectric 54, and the combined actuator and fixed capacitive plate 57 form a selectable capacitive element.

When no actuation signal is applied to the first terminal 44, the alternate MEMS switching capacitive element 56 is not actuated. Therefore, non-actuated spacing between the movable capacitive plate and the combined actuator and fixed capacitive plate 57 establishes a first capacitance presented to the first and second terminals 44, 48. However, when an actuation signal is applied to the first terminal 44, the alternate MEMS switching capacitive element 56 is actuated, thereby moving the cantilever 42 closer to the combined actuator and fixed capacitive plate 57. Therefore, actuated spacing between the movable capacitive plate and the combined actuator and fixed capacitive plate 57 establishes a second capacitance presented to the first and second terminals 44, 48. The second capacitance is greater than the first capacitance due to the reduced spacing between the movable capacitive plate and the combined actuator and fixed capacitive plate 57.

The capacitive dielectric 54 insulates the cantilever 42 from the combined actuator and fixed capacitive plate 57. In one embodiment of the present invention, the capacitive dielectric 54 may prevent shorting of the cantilever 42 to the combined actuator and fixed capacitive plate 57 when the alternate MEMS switching capacitive element 56 is actuated, may reduce or prevent metal undercutting of the combined actuator and fixed capacitive plate 57 during fabrication, or both. In one embodiment of the present invention, in addition to the first terminal 44, a control terminal 52 may be electrically coupled to the combined actuator and fixed capacitive plate 57.

Figure 4C:
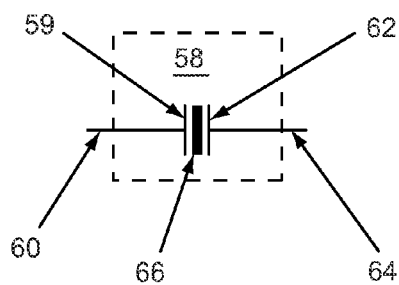
FIG. 4C shows a first integrated fixed capacitive element, according to an additional embodiment of the present invention.

FIG. 4C shows a first integrated fixed capacitive element 58, according to an additional embodiment of the present invention. The first integrated fixed capacitive element 58 includes a first capacitive plate 59 electrically coupled to a first terminal 60, a second capacitive plate 62 electrically coupled to a second terminal 64, and a fixed dielectric 66, which is between the first and second capacitive plates 59, 62. The first and second capacitive plates 59, 62 and the fixed dielectric 66 form a capacitive element with a capacitance presented to the first and second terminals 60, 64.

Figure 5:
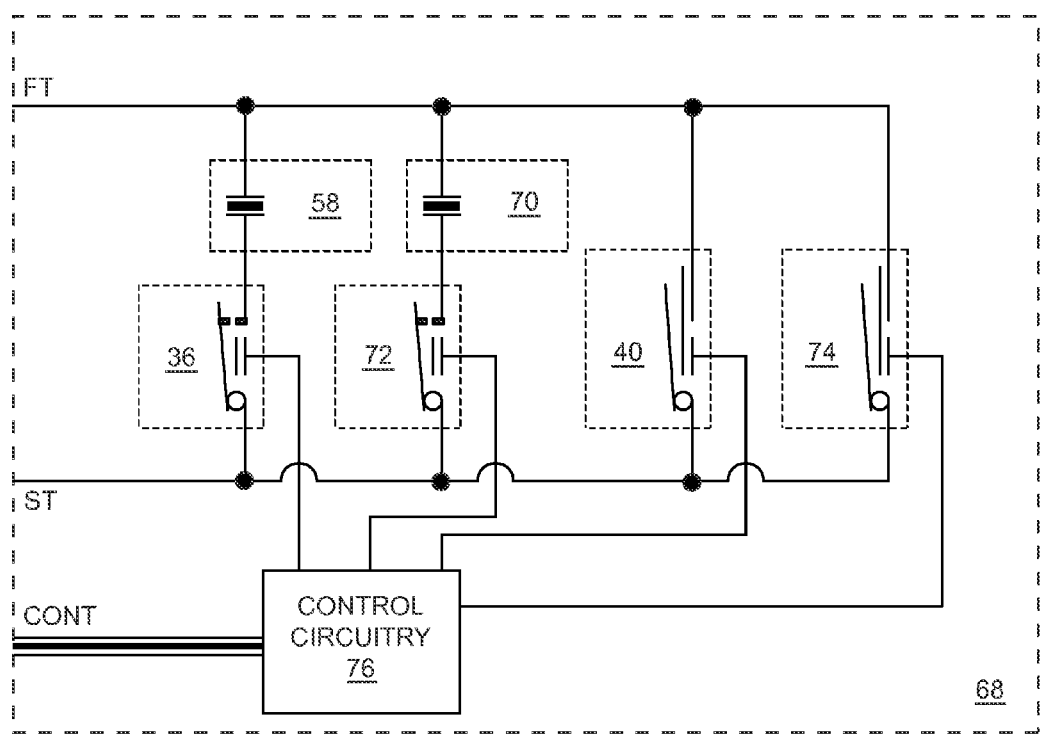
FIG. 5 shows an integrated selectable capacitor bank, according to one embodiment of the present invention.

FIG. 5 shows an integrated selectable capacitor bank 68, according to one embodiment of the present invention. The integrated selectable capacitor bank 68 includes the first integrated fixed capacitive element 58, a second integrated fixed capacitive element 70, the first insulated-actuator MEMS switch 36, a second insulated-actuator MEMS switch 72, the first MEMS switching capacitive element 40, a second MEMS switching capacitive element 74, and control circuitry 76. Each of the integrated fixed capacitive elements 58, 70 is coupled in series with each of the insulated-actuator MEMS switches 36, 72, respectively, and each capacitive element and switch series coupling is coupled between a first terminal FT and a second terminal ST. Additionally, each of the MEMS switching capacitive elements 40, 74 is coupled between the first terminal FT and the second terminal ST.

A control terminal of each of the insulated-actuator MEMS switches 36, 72 and each of the MEMS switching capacitive elements 40, 74 is coupled to and controlled by the control circuitry 76, which receives control information via a control interface CONT. The capacitance of the integrated selectable capacitor bank 68 is presented to the first and second terminals FT, ST. An external device (not shown) controls the capacitance of the integrated selectable capacitor bank 68 based on the control information by selecting the appropriate combination of integrated fixed capacitive elements 58, 70 and selected MEMS switching capacitive elements 40, 74 to provide the desired capacitance. In alternate embodiments of the present invention, any or all of the first integrated fixed capacitive element 58, the second integrated fixed capacitive element 70, the first insulated-actuator MEMS switch 36, the second insulated-actuator MEMS switch 72, the first MEMS switching capacitive element 40, and the second MEMS switching capacitive element 74 may be omitted. Further, additional insulated-actuator MEMS switches 36, 72, MEMS switching capacitive elements 40, 74, integrated fixed capacitive elements 58, 70, or any combination thereof, may be included.

Figure 6:
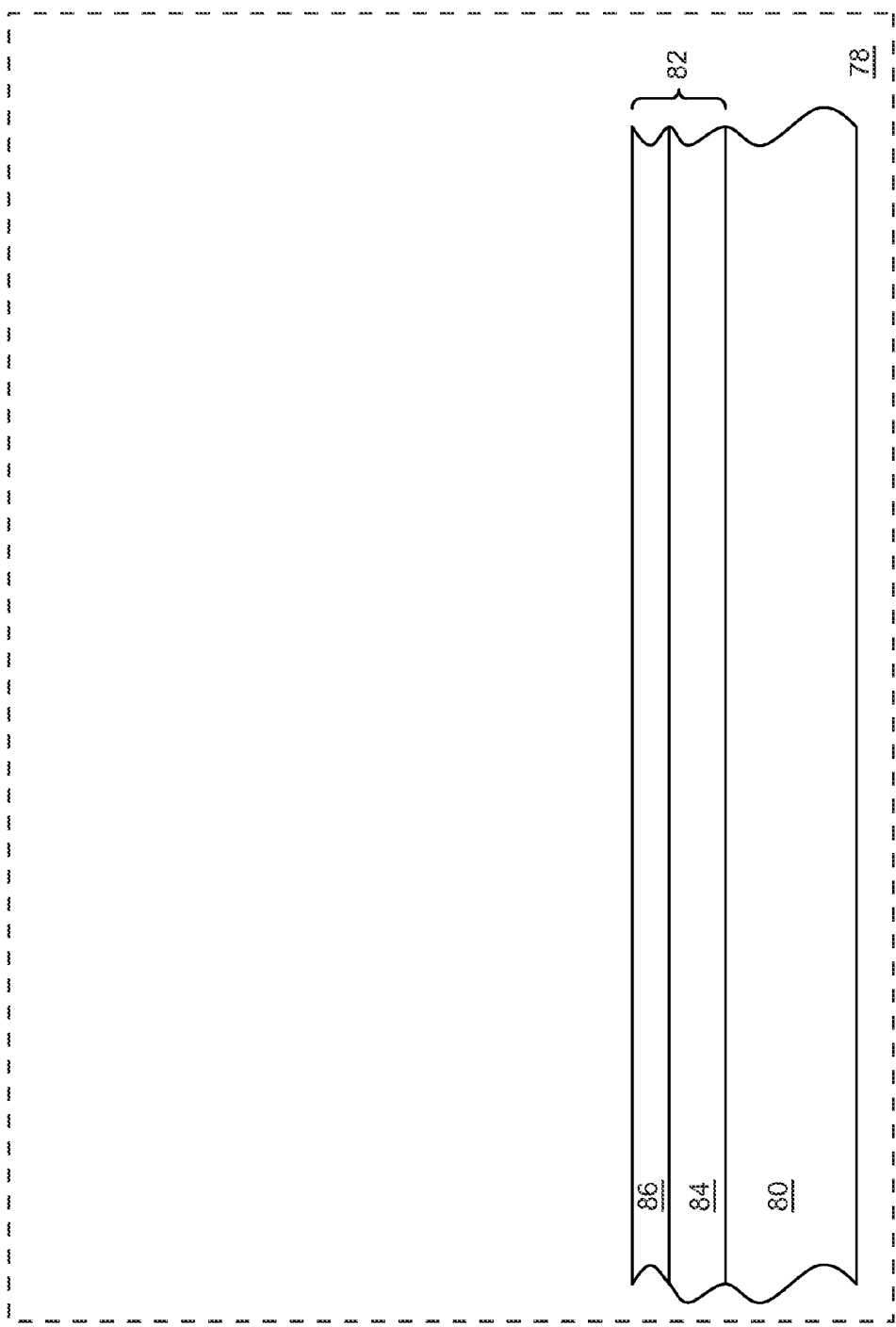
FIG. 6 shows a first region of a semiconductor die, according to one embodiment of the present invention.

FIG. 6 shows a first region of a semiconductor die 78, according to one embodiment of the present invention. The semiconductor die 78 includes a substrate 80, which may be a semiconductor substrate, such as Silicon. A substrate insulator layer 82 is over the substrate 80 and includes a first insulator layer 84 and a second insulator layer 86. The first insulator layer 84 may include Silicon Nitride and the second insulator layer 86 may include Silicon Dioxide. In alternate embodiments of the present invention, the substrate insulator layer 82 may be a single layer, may include multiple layers, the first insulator layer 84 may include other insulating material, the second insulator layer 86 may include other insulating material, or any combination thereof.

Figure 7:
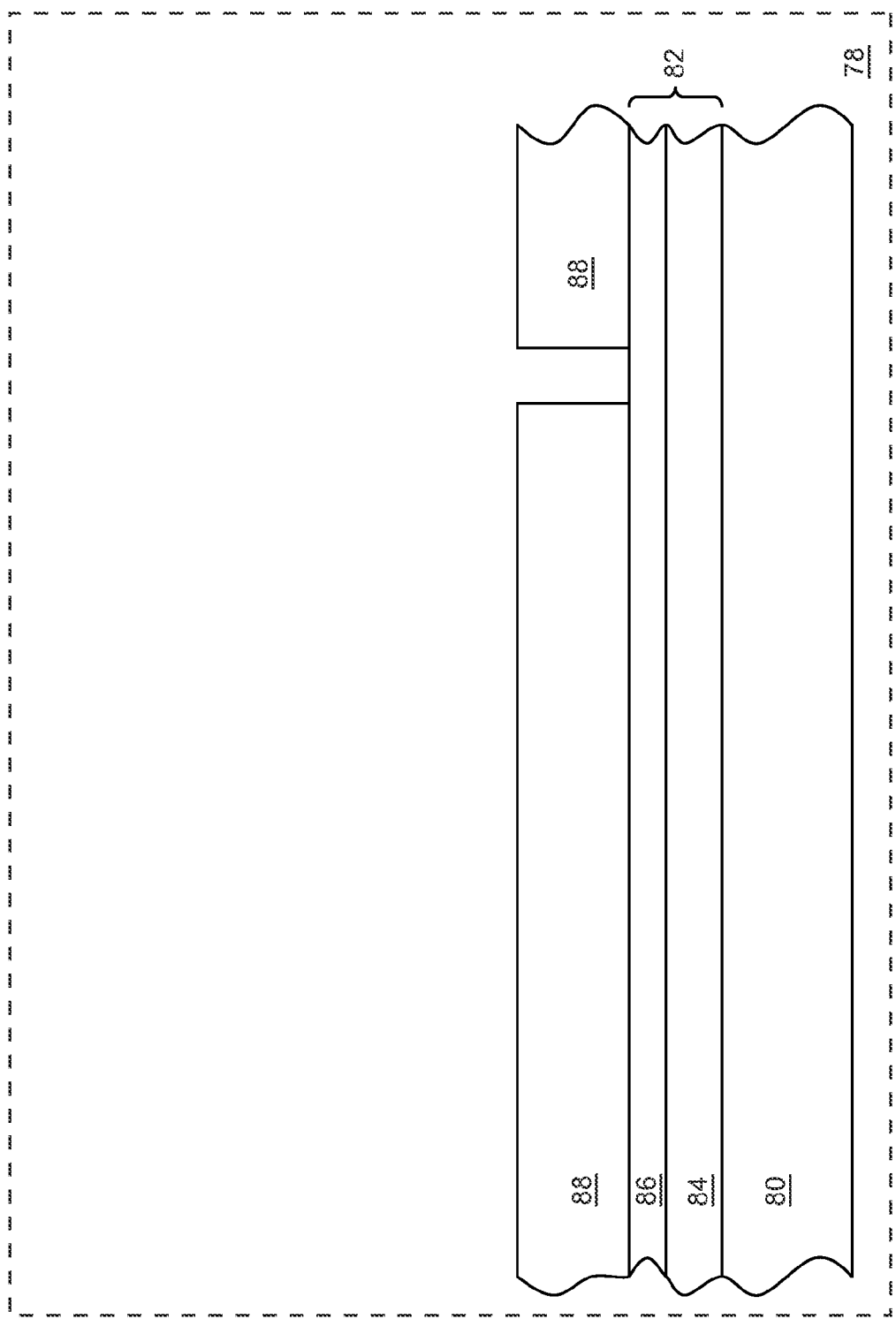
FIG. 7 shows a first patterned photoresist layer added to the semiconductor die illustrated in FIG. 6.
Figure 8:
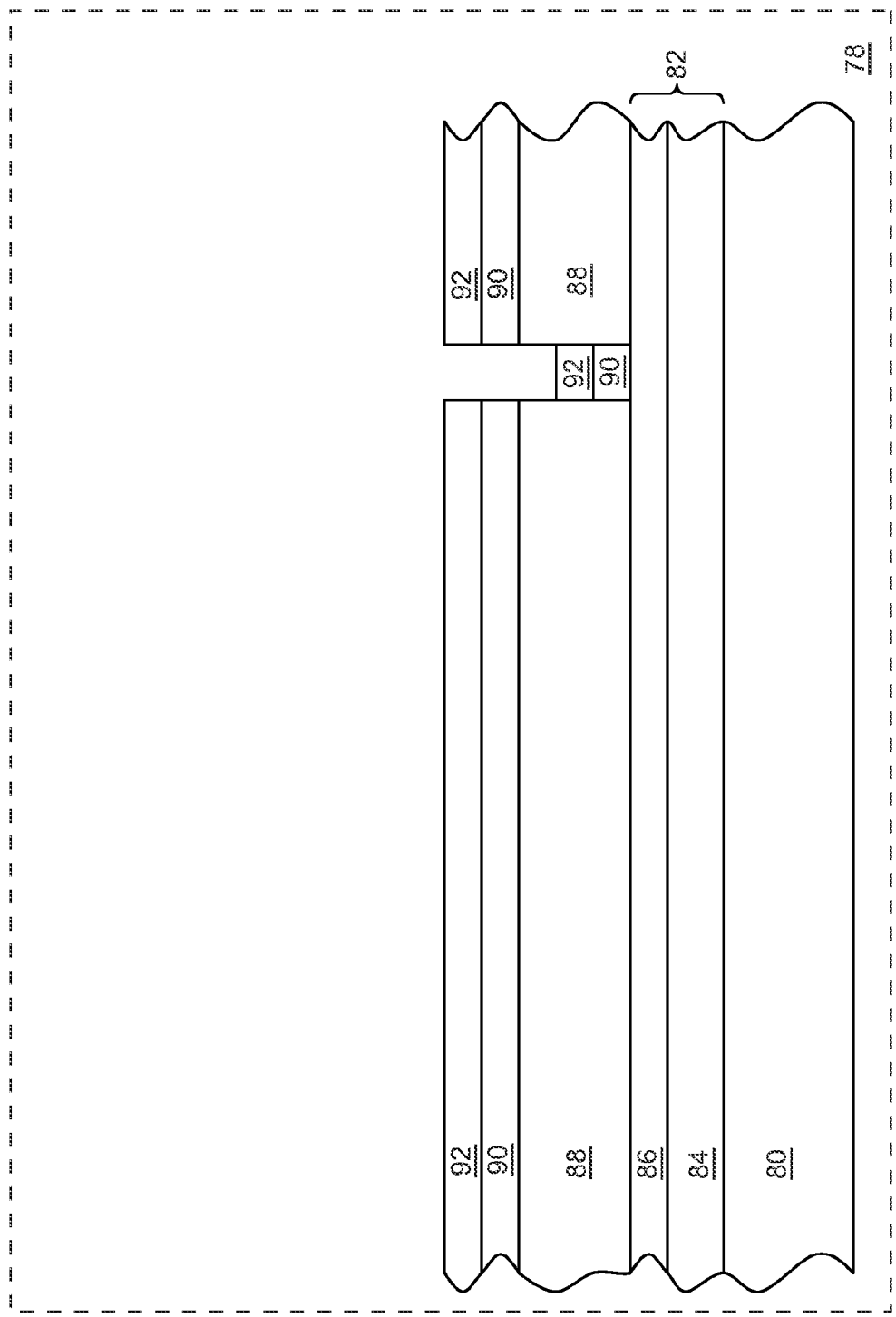
FIG. 8 shows a first metallic adhesion layer and a first metallic structural layer added to the semiconductor die illustrated in FIG. 7.

FIG. 7 shows a first patterned photoresist layer 88 added to the semiconductor die 78 illustrated in FIG. 6 and formed over the second insulator layer 86. FIG. 8 shows a first metallic adhesion layer 90 and a first metallic structural layer 92 added to the semiconductor die 78 illustrated in FIG. 7. The first metallic adhesion layer 90 is formed over the first patterned photoresist layer 88 and the second insulator layer 86. The first metallic structural layer 92 is formed over the first metallic adhesion layer 90, which may include Titanium, Chromium, Titanium Tungsten alloy, or other suitable material, and is used to bond the first metallic structural layer 92 to the substrate insulator layer 82. The first metallic structural layer 92 may include Gold, Copper, or Aluminum.

Figure 9:
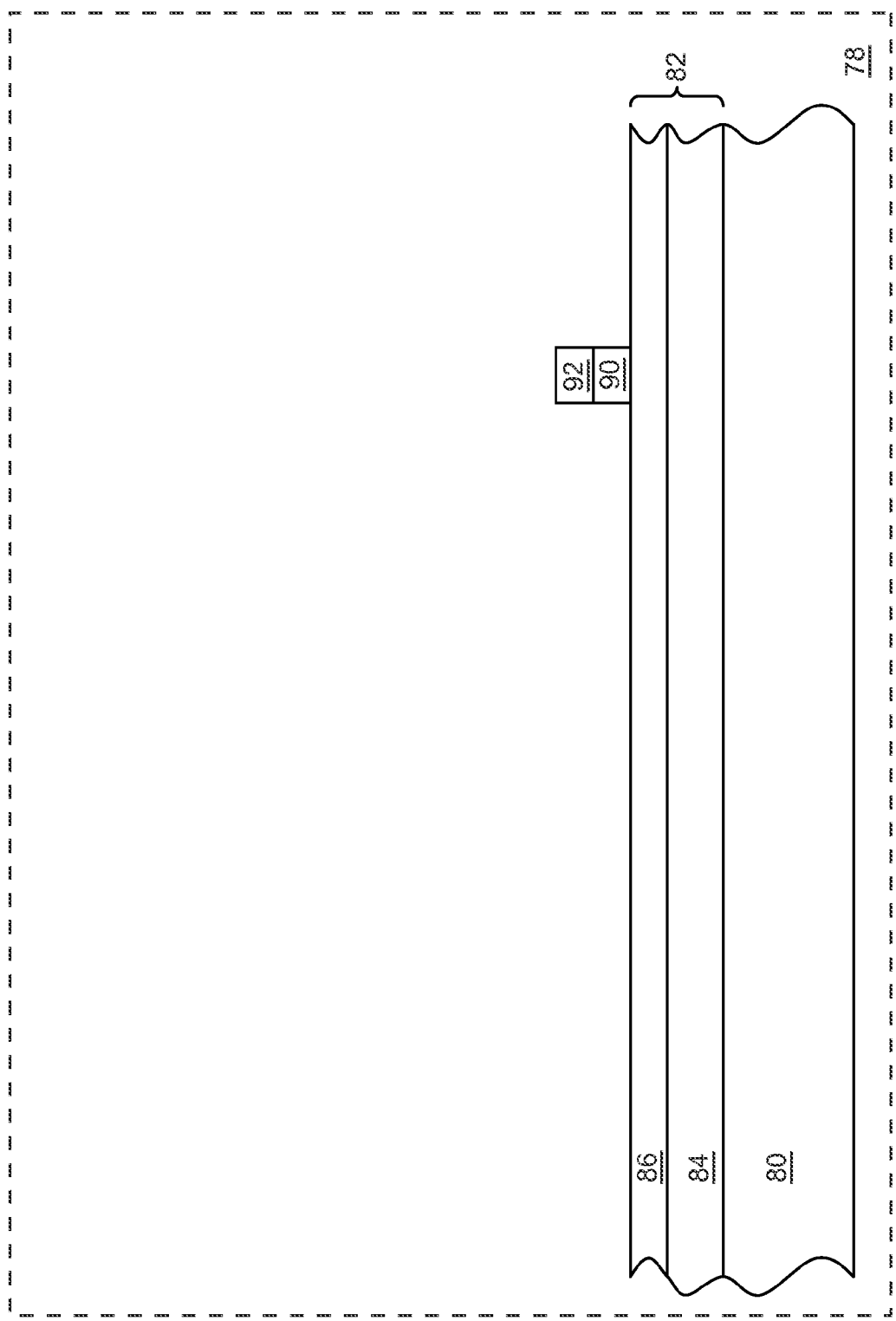
FIG. 9 shows the remnants of the first metallic adhesion layer and the first metallic structural layer after lifting-off the portions of the first metallic adhesion layer and the first metallic structural layer that were formed over the first patterned photoresist layer as illustrated in FIG. 8.

FIG. 9 shows the remnants of the first metallic adhesion layer 90 and the first metallic structural layer 92 after lifting-off the portion of the first metallic adhesion layer 90 and the first metallic structural layer 92 that were formed over the first patterned photoresist layer 88 as illustrated in FIG. 8. The remnants of the first metallic adhesion layer 90 and the first metallic structural layer 92 provide a bump, which will be used to form the fixed contact 26 of the first insulated-actuator MEMS switch 36. Alternate embodiments of the present invention may use other techniques to form the bump, such as using a single layer to form the bump, using other methods of patterning the first metallic adhesion layer 90 and the first metallic structural layer 92, or the like.

Figure 10:
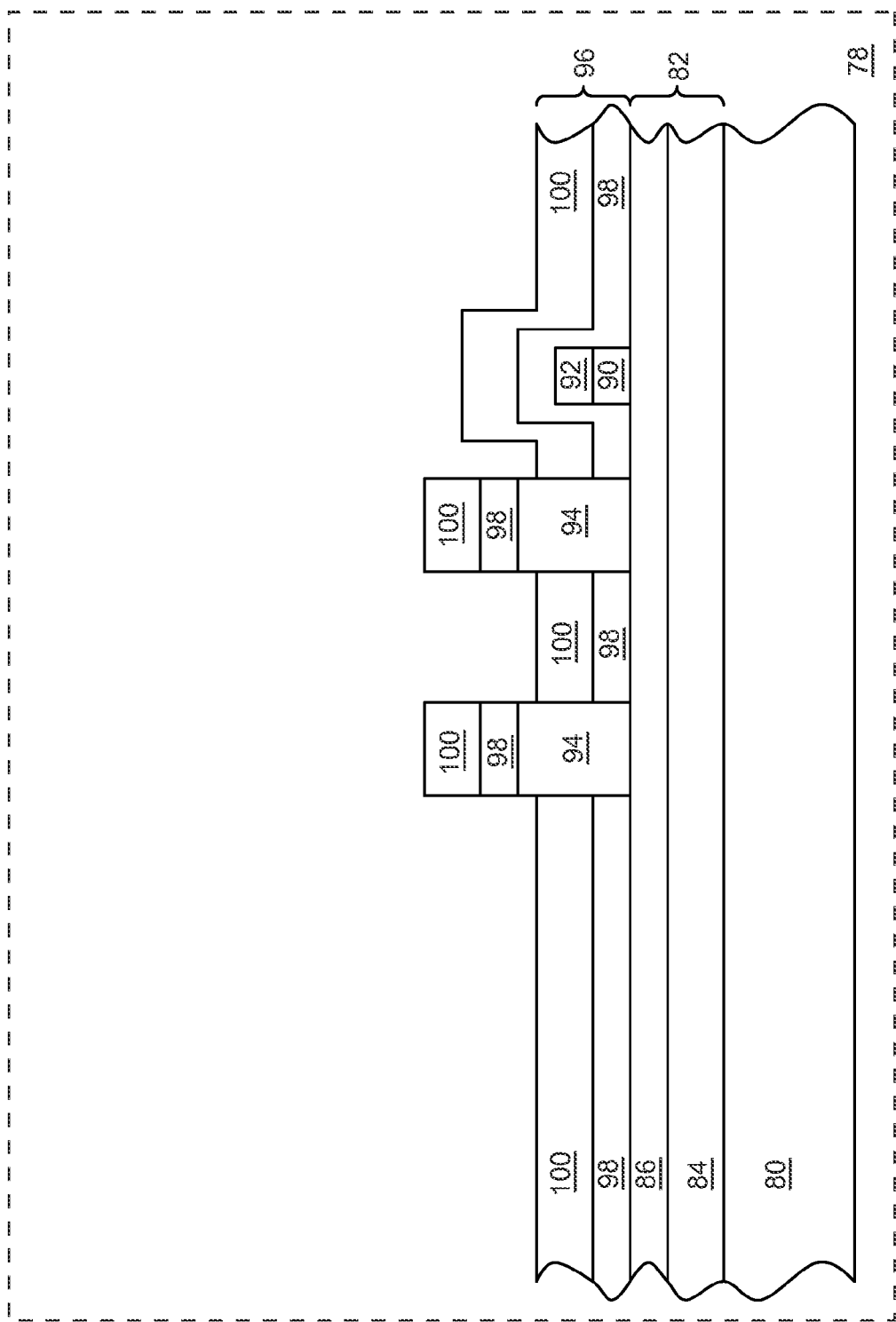
FIG. 10 shows a second patterned photoresist layer and a first metallization layer added to the semiconductor die illustrated in FIG. 9.

FIG. 10 shows a second patterned photoresist layer 94 and a first metallization layer 96 added to the semiconductor die 78 illustrated in FIG. 9. The first metallization layer 96 includes a second metallic adhesion layer 98 and a second metallic structural layer 100. The second patterned photoresist layer 94 is formed over the second insulator layer 86. The second metallic adhesion layer 98 is formed over the second patterned photoresist layer 94, the second insulator layer 86, and the first metallic structural layer 92. The second metallic structural layer 100 is formed over the second metallic adhesion layer 98. The second metallic adhesion layer 98 may include Titanium, Chromium, Titanium Tungsten alloy, or other suitable material, and is used to bond the second metallic structural layer 100 to the substrate insulator layer 82, to the first metallic structural layer 92, or both. The second metallic structural layer 100 may include Gold, Copper, or Aluminum. In alternate embodiments of the present invention, the first metallization layer 96 may be a single layer, may include multiple layers, the second metallic adhesion layer 98 may include other conductive material, the second metallic structural layer 100 may include other conductive material, or any combination thereof.

Figure 11:
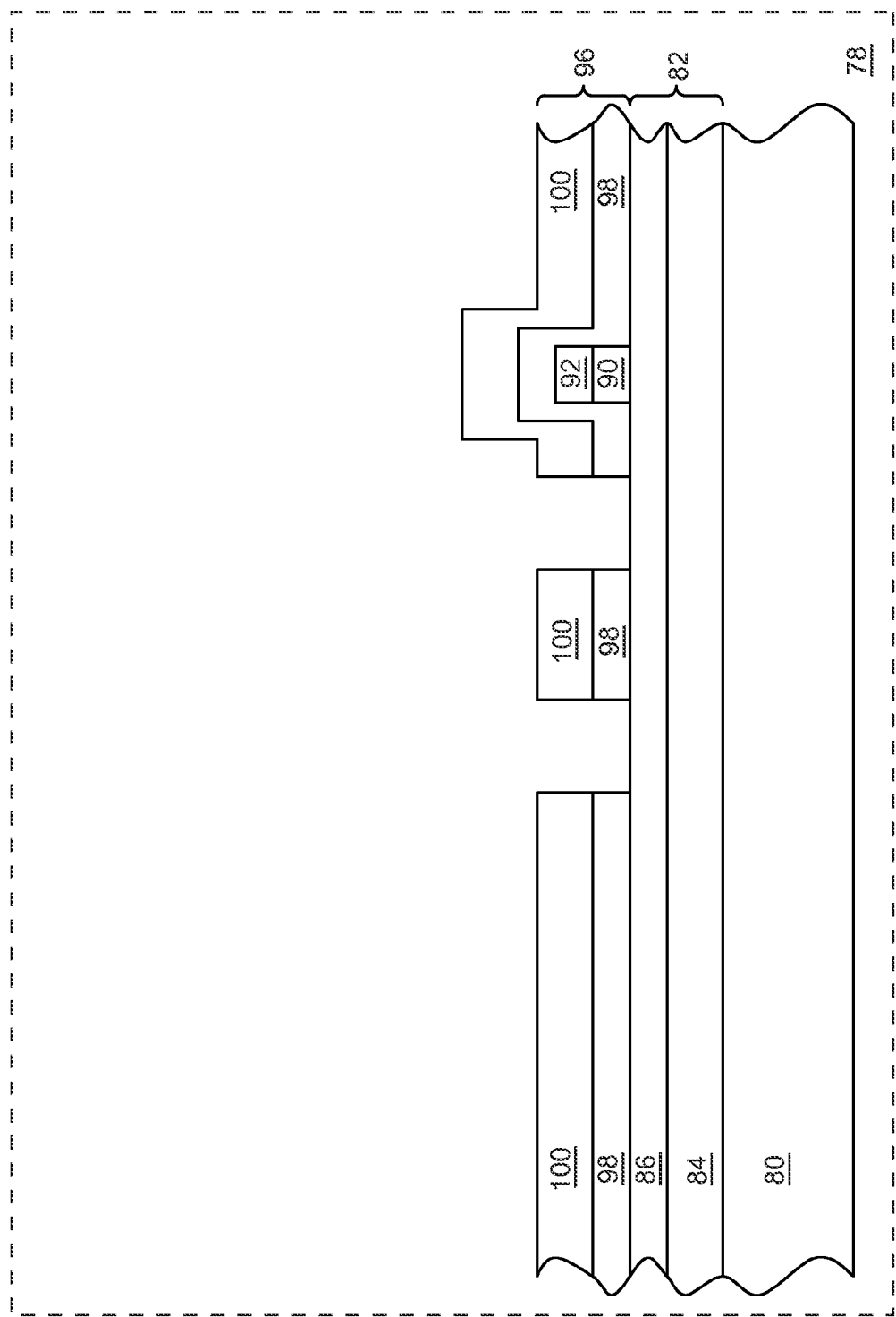
FIG. 11 shows the remnants of the first metallization layer after lifting-off the portion of the first metallization layer that was formed over the second patterned photoresist layer as illustrated in FIG. 10.

FIG. 11 shows the remnants of the first metallization layer 96 after lifting-off the portion of the first metallization layer 96 that was formed over the second patterned photoresist layer 94 as illustrated in FIG. 10. Alternate embodiments of the present invention may use other techniques to pattern the first metallization layer 96, such as using a single layer to provide the first metallization layer 96, using other methods of patterning the second metallic adhesion layer 98, using other methods of patterning the second metallic structural layer 100, or the like.

Figure 12:
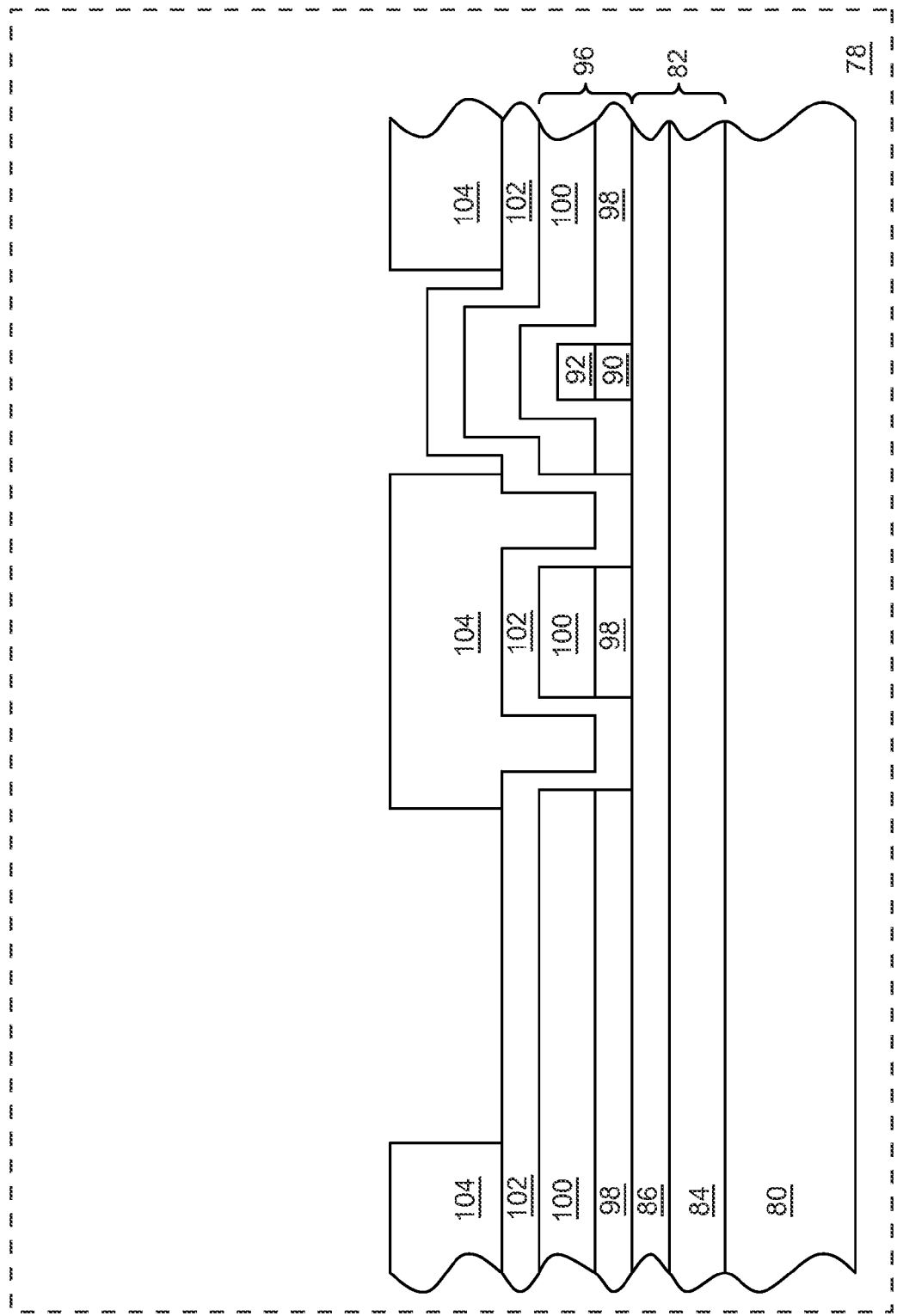
FIG. 12 shows a third insulator layer and a third patterned photoresist layer added to the semiconductor die illustrated in FIG. 11.
Figure 13:
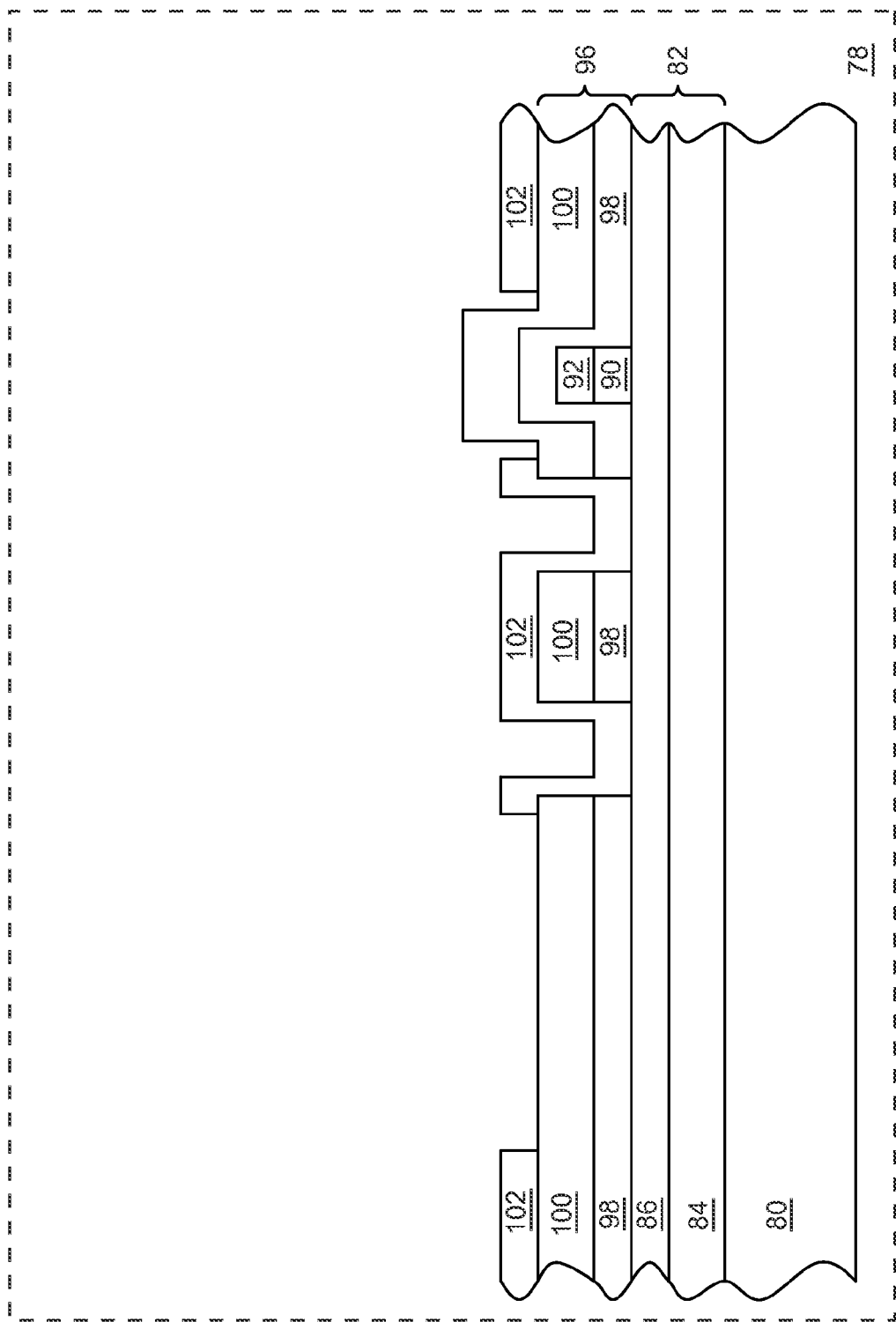
FIG. 13 shows the remnants of the third insulator layer after etching away a portion of the third insulator layer illustrated in FIG. 12.

FIG. 12 shows a third insulator layer 102 and a third patterned photoresist layer 104 added to the semiconductor die 78 illustrated in FIG. 11. The third insulator layer 102 is formed over the second metallic structural layer 100 and the second insulator layer 86. In one embodiment of the present invention, the third insulator layer 102 is deposited over the second metallic structural layer 100 using plasma enhanced chemical vapor deposition (PECVD). In another embodiment of the present invention, the third insulator layer 102 is deposited over the second metallic structural layer 100 by sputtering. The third patterned photoresist layer 104 is formed over the third insulator layer 102. The third insulator layer 102 may include Silicon Nitride, Silicon Dioxide, or Aluminum Oxide. Areas of the third insulator layer 102 not covered by the third patterned photoresist layer 104 are etched away. In one embodiment of the present invention, the third insulator layer 102 is etched using reactive ion etching (RIE). FIG. 13 shows the remnants of the third insulator layer 102 after etching away a portion of the third insulator layer 102 illustrated in FIG. 12, and after removing the third patterned photoresist layer 104 after etching. Alternate embodiments of the present invention may use other ways of patterning the third insulator layer 102.

Figure 14:
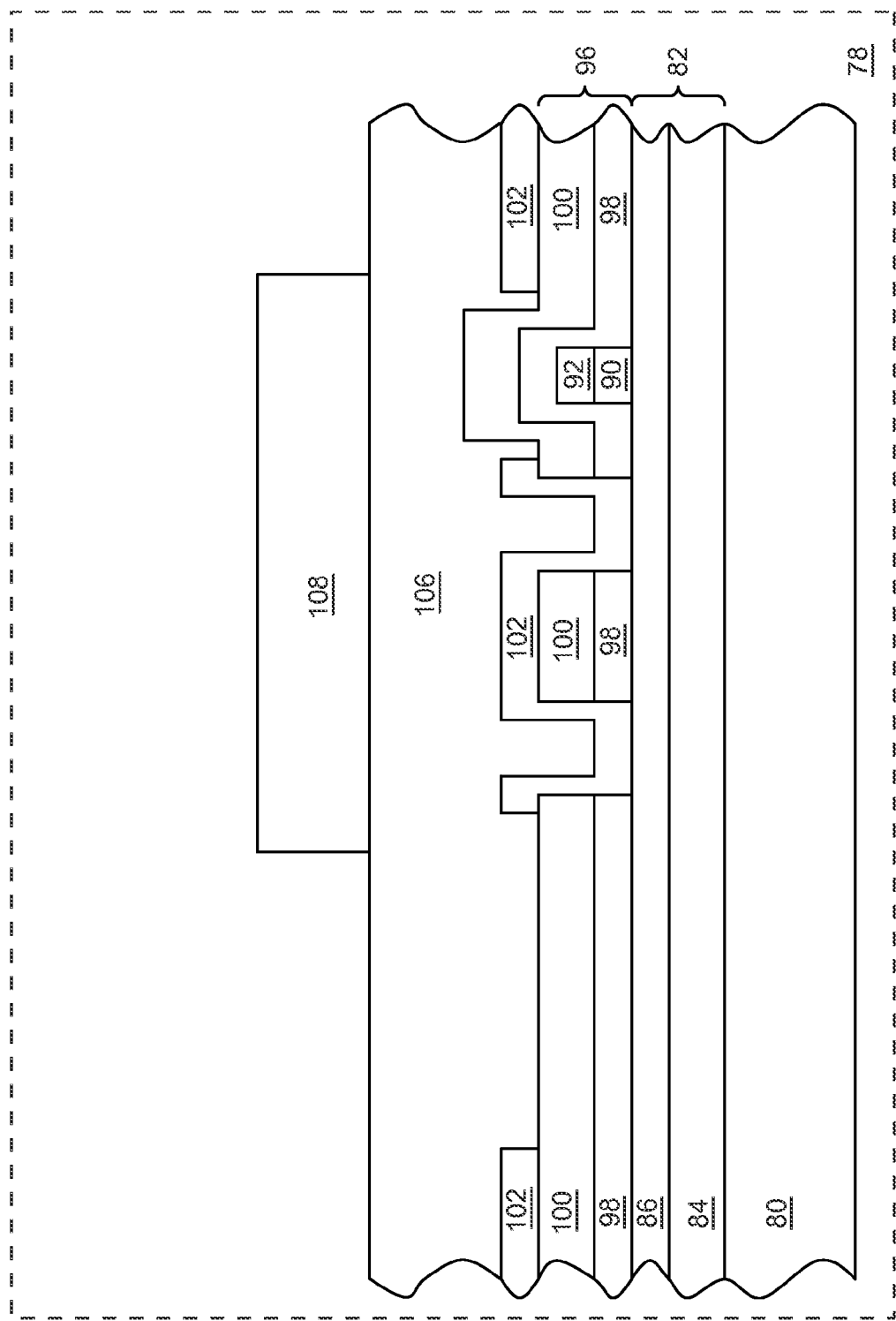
FIG. 14 shows a first sacrificial layer and a fourth patterned photoresist layer added to the semiconductor die illustrated in FIG. 13.

FIG. 14 shows a first sacrificial layer 106 and a fourth patterned photoresist layer 108 added to the semiconductor die 78 illustrated in FIG. 13. The first sacrificial layer 106 is formed over the third insulator layer 102 and the second metallic structural layer 100. The fourth patterned photoresist layer 108 is formed over the first sacrificial layer 106. The first sacrificial layer 106 will be used to provide clearance between the movable contact 24 and the fixed contact 26 of the first insulated-actuator MEMS switch 36. Areas of the first sacrificial layer 106 not covered by the fourth patterned photoresist layer 108 are etched away. In one embodiment of the present invention, the first sacrificial layer 106 is etched using RIE. In another embodiment of the present invention, the first sacrificial layer 106 is etched using wet etching.

Figure 15:
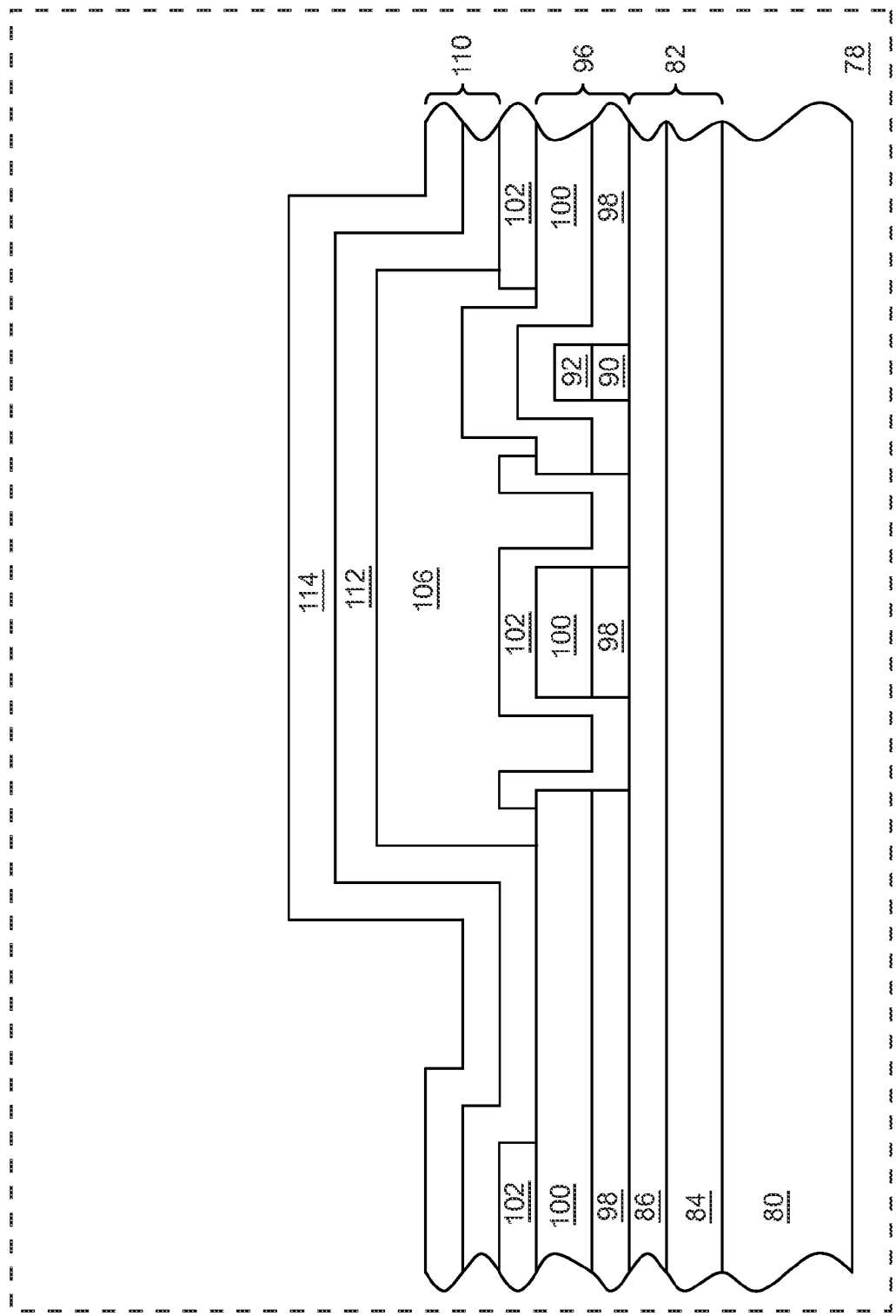
FIG. 15 shows the remnants of the first sacrificial layer after etching away a portion of the first sacrificial layer and shows a second metallization layer added to the semiconductor die illustrated in FIG. 14.

FIG. 15 shows the remnants of the first sacrificial layer 106 after etching away a portion of the first sacrificial layer 106 and after removing the fourth patterned photoresist layer 108 after etching, and shows a second metallization layer 110 added to the semiconductor die 78 illustrated in FIG. 14. The second metallization layer 110 includes a third metallic adhesion layer 112 and a third metallic structural layer 114. The third metallic adhesion layer 112 is formed over the third insulator layer 102, the second metallic structural layer 100, and the first sacrificial layer 106. The third metallic structural layer 114 is formed over the third metallic adhesion layer 112. Alternate embodiments of the present invention may use other ways of patterning the first sacrificial layer 106.

Figure 16:
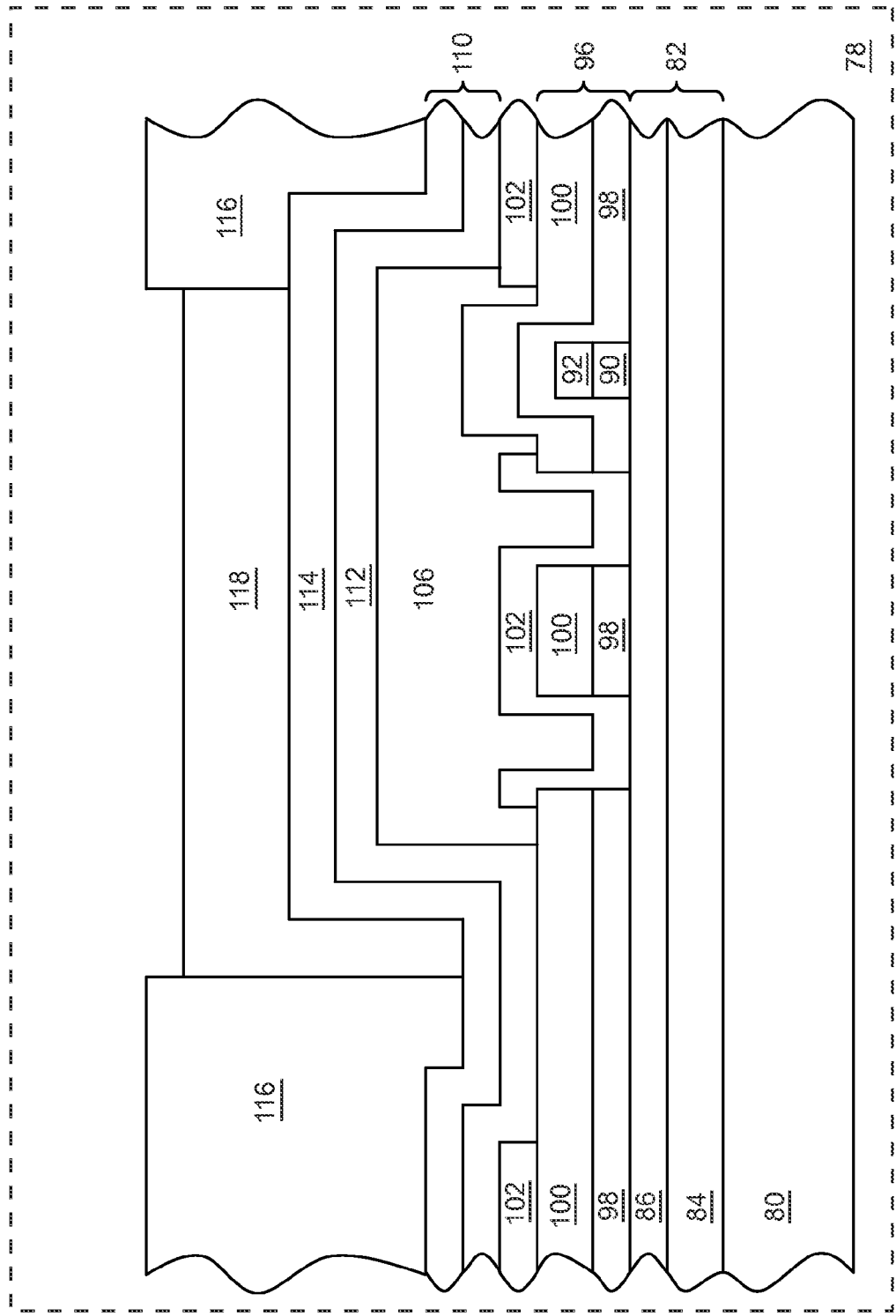
FIG. 16 shows a patterned photoresist mold and a MEMS cantilever structure layer added to the semiconductor die illustrated in FIG. 15.

FIG. 16 shows a patterned photoresist mold 116 and a MEMS cantilever structure layer 118 added to the semiconductor die 78 illustrated in FIG. 15. The patterned photoresist mold 116 is formed over the third metallic structural layer 114. The MEMS cantilever structure layer 118 is then formed over the portion of the third metallic structural layer 114 that is not covered by the patterned photoresist mold 116. The MEMS cantilever structure layer 118 may formed over the third metallic structural layer 114 by electroplating or by another technique. The second metallization layer 110 may function as a seed layer for the MEMS cantilever structure layer 118. After the MEMS cantilever structure layer 118 is formed, the patterned photoresist mold 116 is removed.

Figure 17:
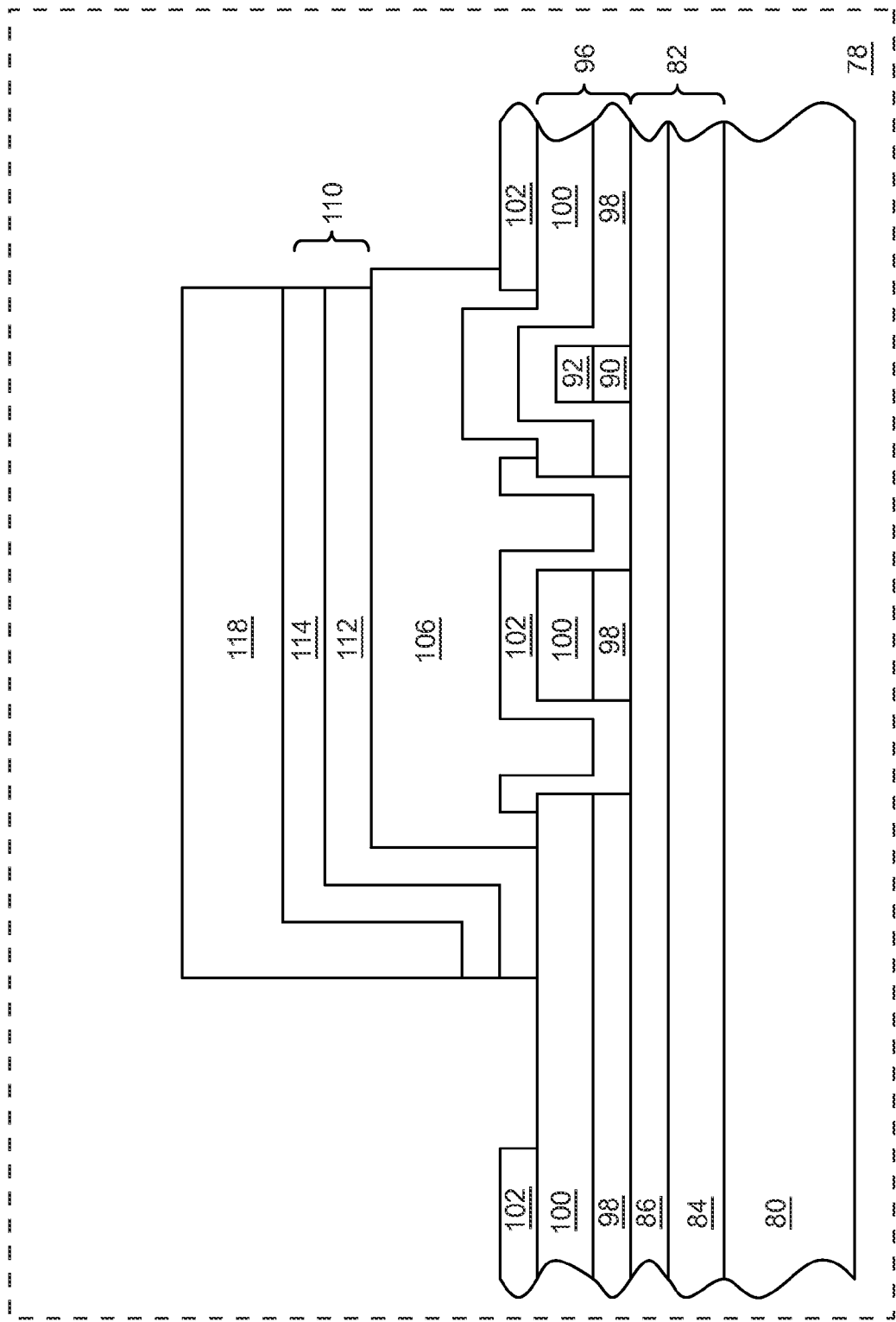
FIG. 17 shows the remnants of the second metallization layer and the MEMS cantilever structure layer after etching away a portion of the second metallization layer and the MEMS cantilever structure layer illustrated in FIG. 16.
Figure 18:
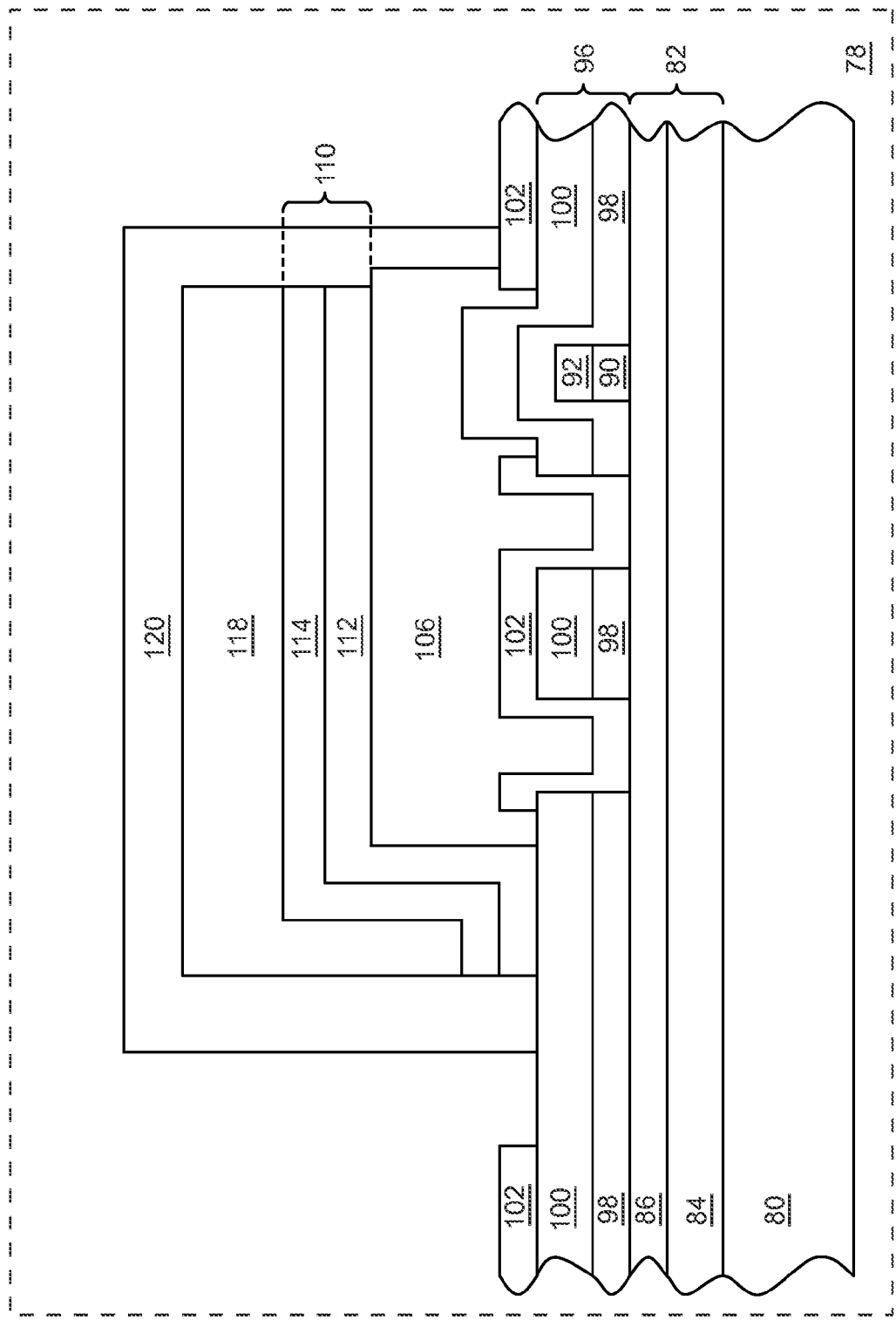
FIG. 18 shows a patterned second sacrificial layer added to the semiconductor die illustrated in FIG. 16.

FIG. 17 shows the remnants of the second metallization layer 110 and the MEMS cantilever structure layer 118 after etching away a portion of the second metallization layer 110 and the MEMS cantilever structure layer 118 illustrated in FIG. 16. In one embodiment of the present invention, the third insulator layer 102 protects the first metallization layer 96 from being undercut as a result of etching the second metallization layer 110. FIG. 18 shows a patterned second sacrificial layer 120 added to the semiconductor die 78 illustrated in FIG. 17. The patterned second sacrificial layer 120 is formed over the MEMS cantilever structure layer 118, the third metallic structural layer 114, the third metallic adhesion layer 112, the first sacrificial layer 106, the third insulator layer 102, and the second metallic structural layer 100.

Figure 19:
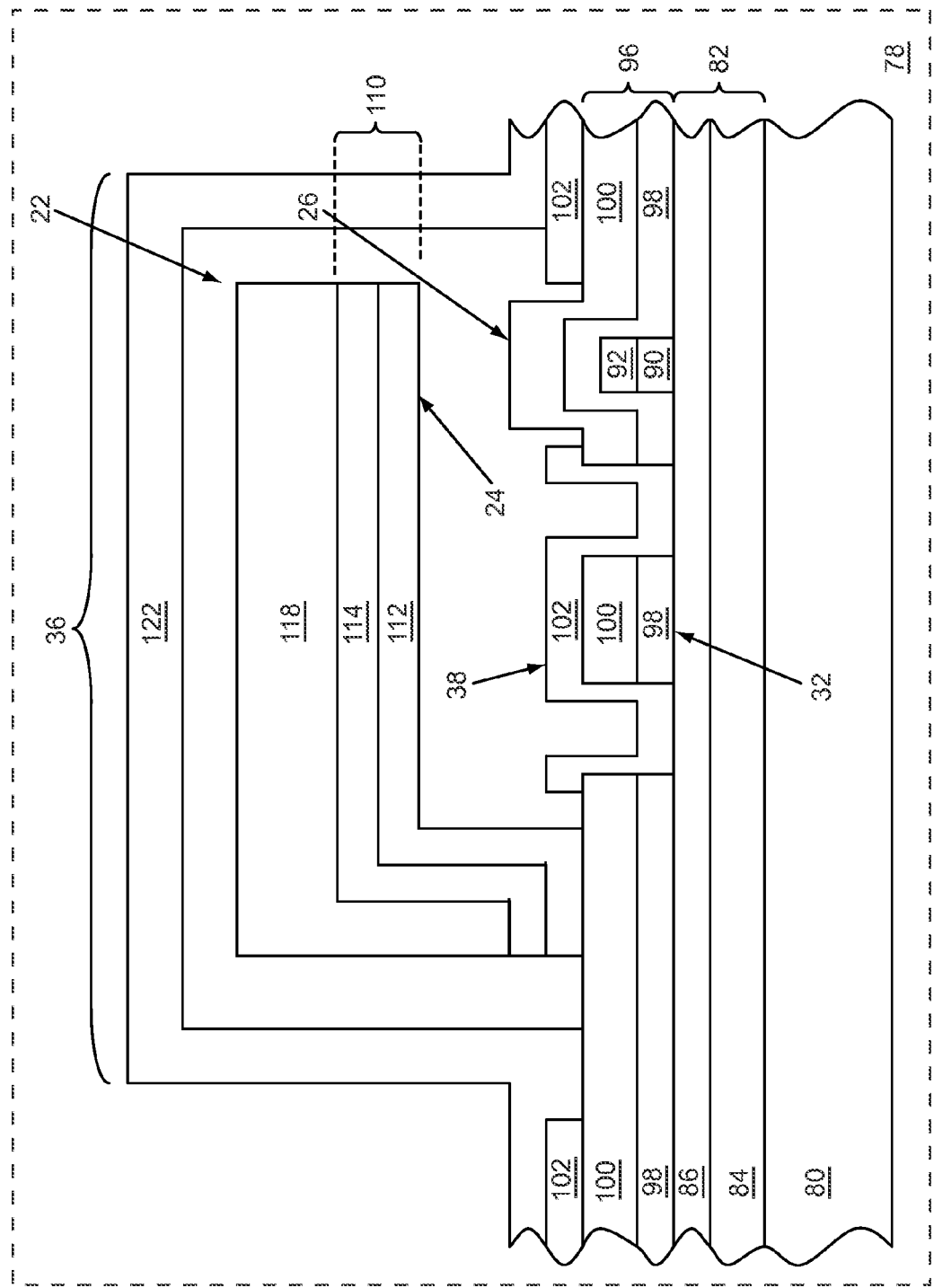
FIG. 19 shows a dome layer added to the semiconductor die illustrated in FIG. 18 to provide the first insulated-actuator MEMS switch.

FIG. 19 shows a dome layer 122 added to the semiconductor die 78 illustrated in FIG. 18 to provide the first insulated-actuator MEMS switch 36. The dome layer 122 is formed over the patterned second sacrificial layer 120 to provide a dome for the first insulated-actuator MEMS switch 36. The first sacrificial layer 106 and the patterned second sacrificial layer 120 were evacuated to provide space for the first insulated-actuator MEMS switch 36 to operate freely. The first sacrificial layer 106 and the patterned second sacrificial layer 120 may have been evacuated through evacuation passages, holes, or both in the dome layer 122, in the third insulator layer 102, in the first metallization layer 96, or any combination thereof. The dome layer 122 may include insulating material or conducting material. In one embodiment of the present invention, the dome layer 122 is conducting and the third insulator layer 102 electrically insulates the dome layer 122 from the first metallization layer 96.

The MEMS cantilever structure layer 118, the third metallic structural layer 114, and the third metallic adhesion layer 112 provide the cantilever 22. The second metallic structural layer 100 provides the fixed contact 26, and the third metallic adhesion layer 112 provides the movable contact 24. The first metallization layer 96 provides the actuator 32 and the third insulator layer 102 provides the actuator insulator 38. The fixed contact 26 is electrically coupled to the first terminal 28 (FIG. 3A) through the second metallic structural layer 100, the second terminal 30 (FIG. 3A) is electrically coupled to the movable contact 24 through the third metallic adhesion layer 112, and the actuator 32 is electrically coupled to the control terminal 34 (FIG. 3A) through the first metallization layer 96.

In alternate embodiments of the first insulated-actuator MEMS switch 36, a non-cantilever architecture may be used, a different movable member instead of the cantilever 22 may be used, the fixed contact 26, the movable contact 24, the actuator 32, the actuator insulator 38, the cantilever 22, or any combination thereof may be provided using a different architecture. Additional layers may be included in any order. Any of the first insulator layer 84, the second insulator layer 86, the first metallic adhesion layer 90, the first metallic structural layer 92, the second metallic adhesion layer 98, the second metallic structural layer 100, the third metallic adhesion layer 112, the third metallic structural layer 114, the MEMS cantilever structure layer 118, and the dome layer 122 may be omitted.

Figure 20:
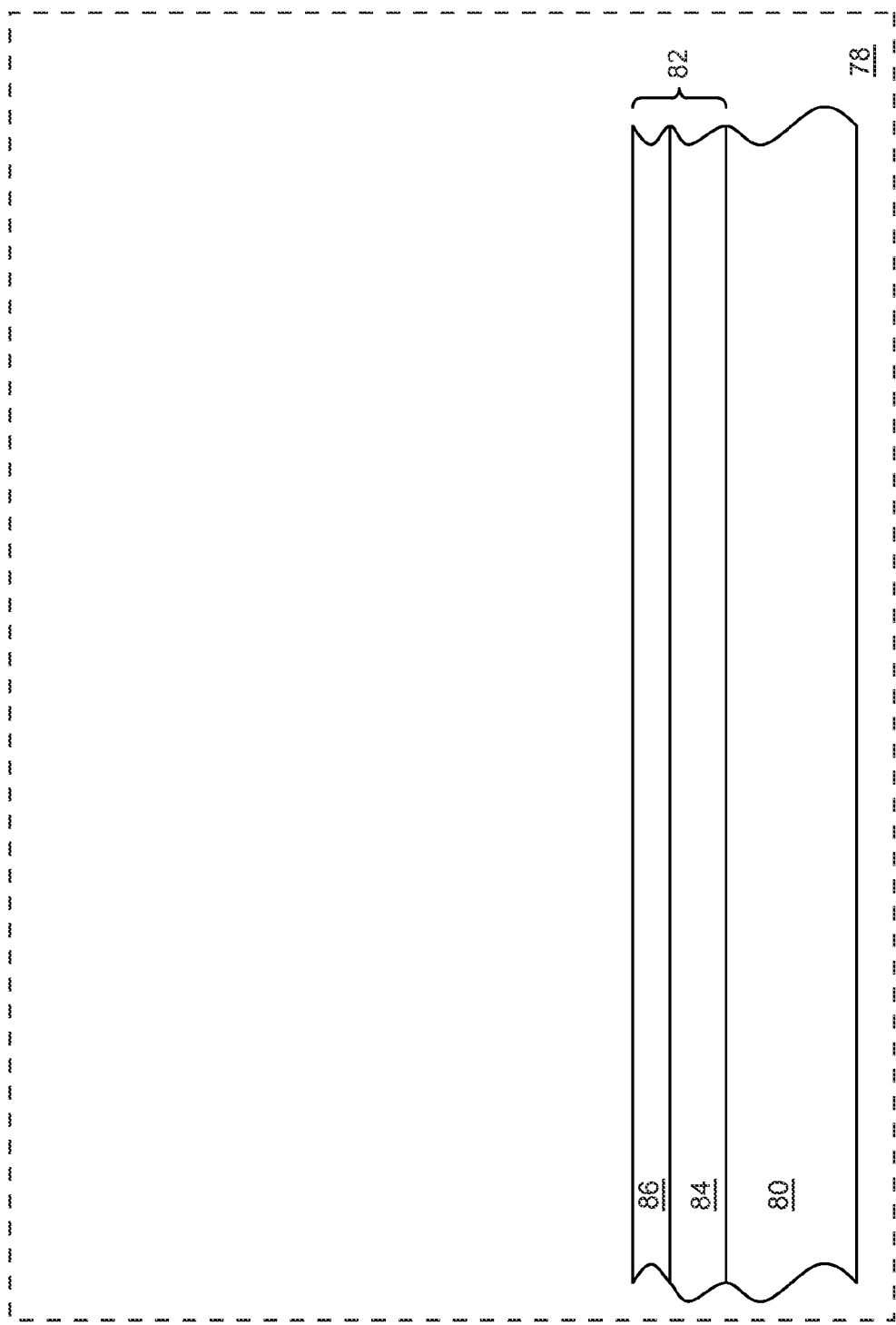
FIG. 20 shows a second region of the semiconductor die, according to one embodiment of the present invention.

FIG. 20 shows a second region of the semiconductor die 78, according to one embodiment of the present invention. The semiconductor die 78 includes the substrate 80, which may be a semiconductor substrate, such as Silicon. The substrate insulator layer 82 is over the substrate 80 and includes the first insulator layer 84 and the second insulator layer 86. The first insulator layer 84 may include Silicon Nitride and the second insulator layer 86 may include Silicon Dioxide. In alternate embodiments of the present invention, the substrate insulator layer 82 may be a single layer, may include multiple layers, the first insulator layer 84 may include other insulating material, the second insulator layer 86 may include other insulating material, or any combination thereof.

Figure 21:
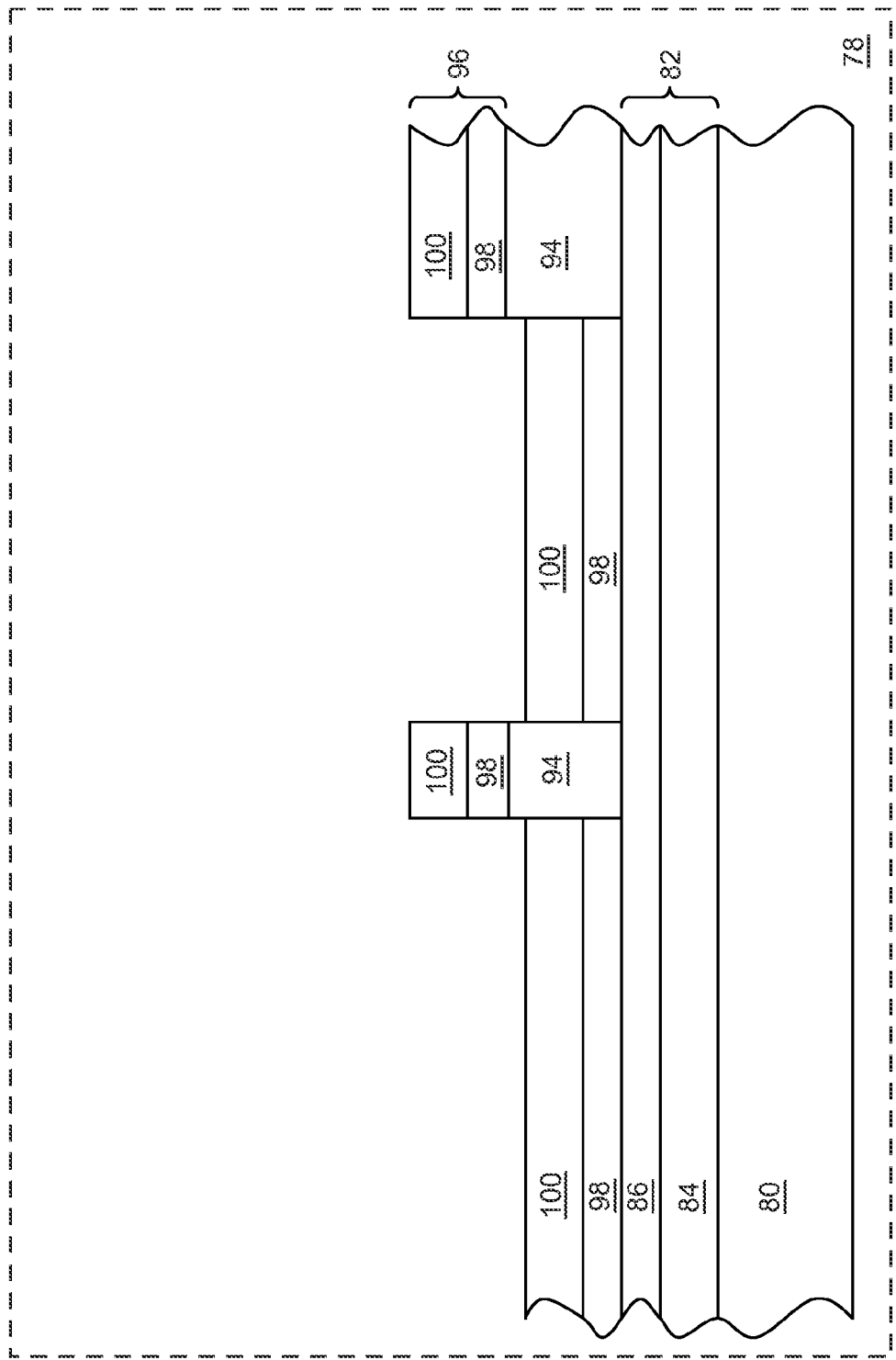
FIG. 21 shows the second patterned photoresist layer and the first metallization layer added to the semiconductor die illustrated in FIG. 20.

FIG. 21 shows the second patterned photoresist layer 94 and the first metallization layer 96 added to the semiconductor die 78 illustrated in FIG. 20. The first metallization layer 96 includes the second metallic adhesion layer 98 and the second metallic structural layer 100. The second patterned photoresist layer 94 is formed over the second insulator layer 86. The second metallic adhesion layer 98 is formed over the second patterned photoresist layer 94 and the second insulator layer 86. The second metallic structural layer 100 is formed over the second metallic adhesion layer 98. The second metallic adhesion layer 98 may include Titanium or Chromium and is used to bond the second metallic structural layer 100 to the substrate insulator layer 82. The second metallic structural layer 100 may include Gold, Copper, or Aluminum. In alternate embodiments of the present invention, the first metallization layer 96 may be a single layer, may include multiple layers, the second metallic adhesion layer 98 may include other conductive material, the second metallic structural layer 100 may include other conductive material, or any combination thereof.

Figure 22:
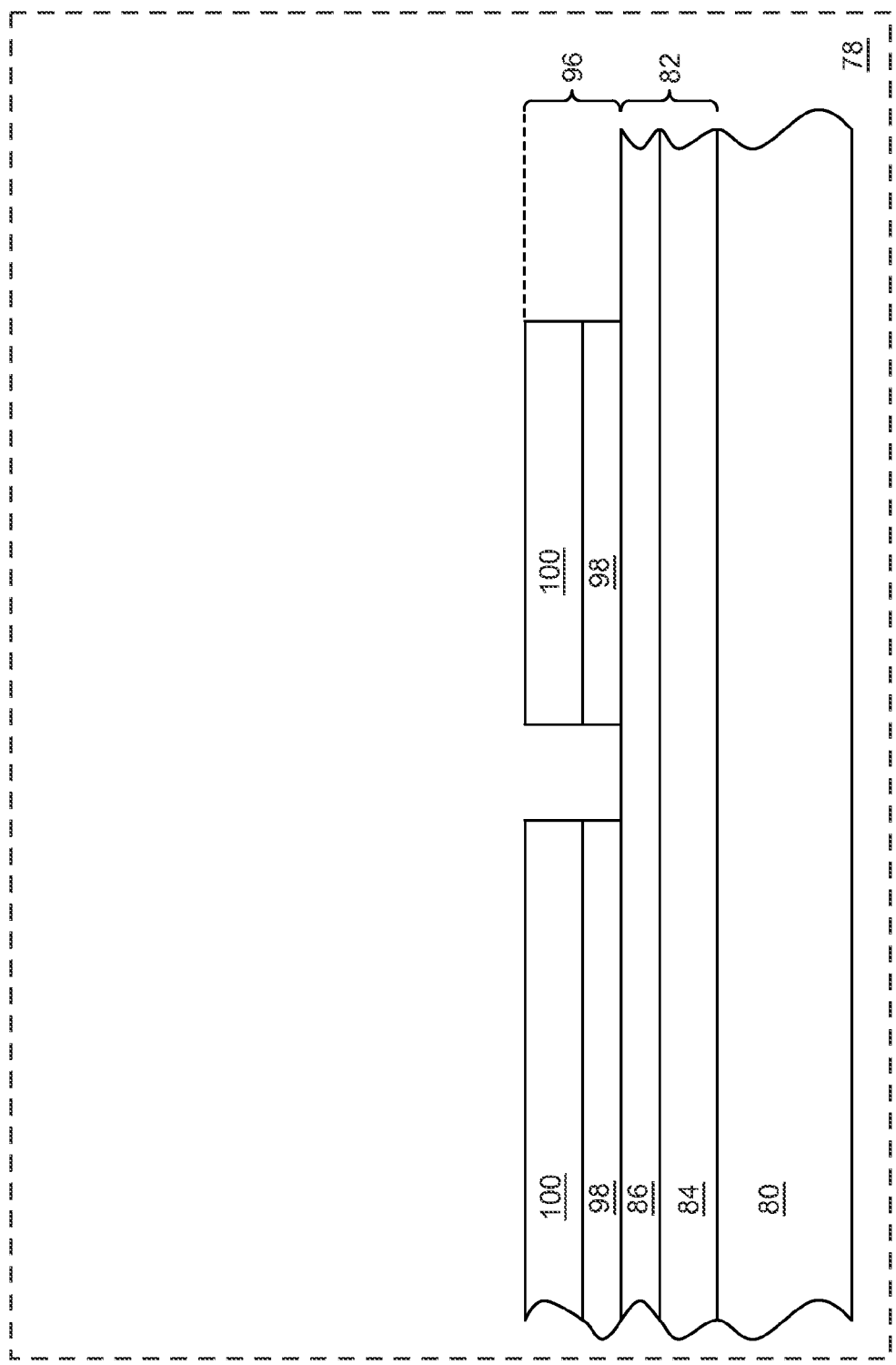
FIG. 22 shows the remnants of the first metallization layer after lifting-off the portion of the first metallization layer that was formed over the second patterned photoresist layer as illustrated in FIG. 21.

FIG. 22 shows the remnants of the first metallization layer 96 after lifting-off the portion of the first metallization layer 96 that was formed over the second patterned photoresist layer 94 as illustrated in FIG. 21. Alternate embodiments of the present invention may use other techniques to pattern the first metallization layer 96, such as using a single layer to provide the first metallization layer 96, using other methods of patterning the second metallic adhesion layer 98, using other methods of patterning the second metallic structural layer 100, or the like.

Figure 23:
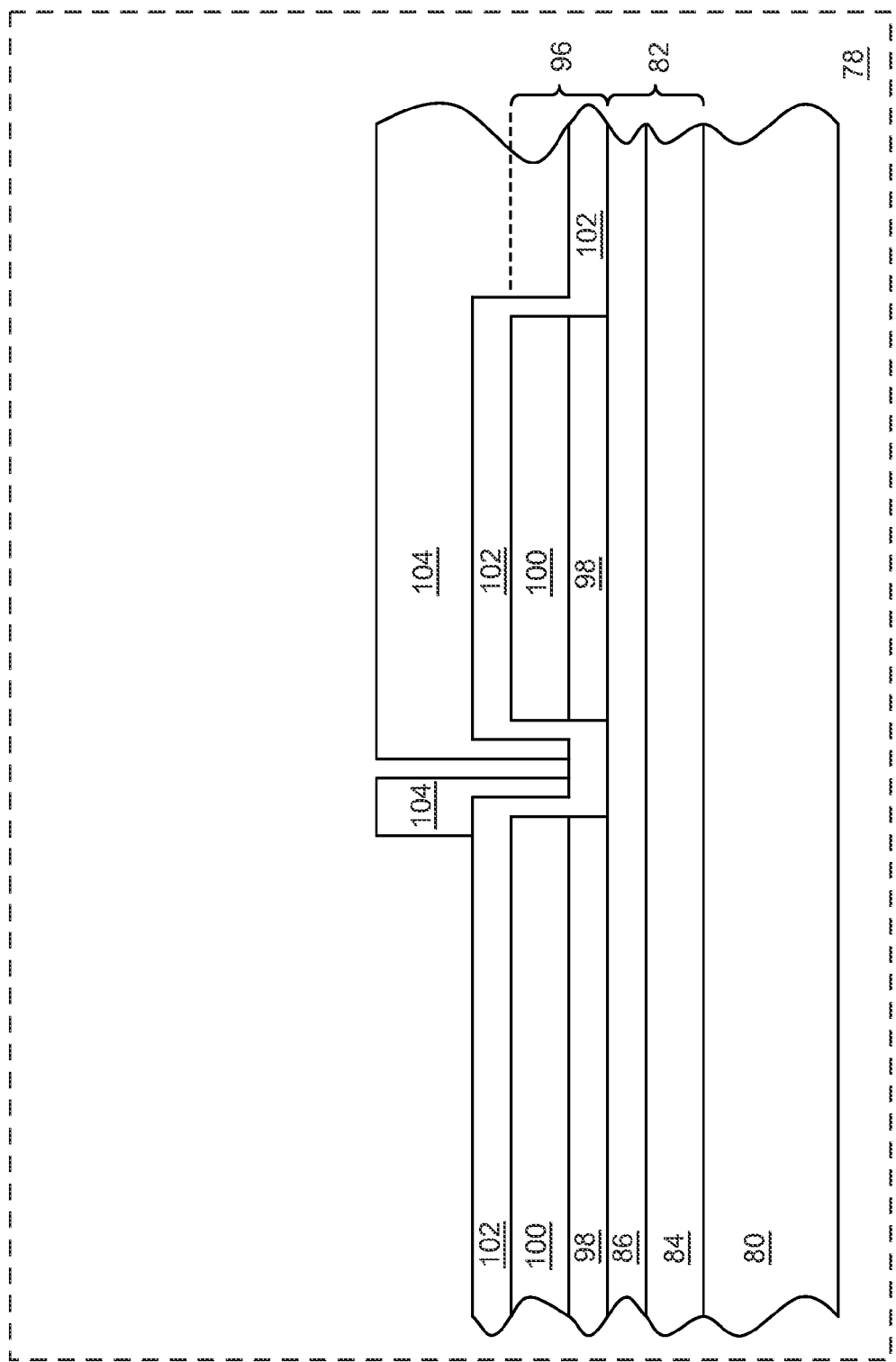
FIG. 23 shows the third insulator layer and the third patterned photoresist layer added to the semiconductor die illustrated in FIG. 22.
Figure 24:
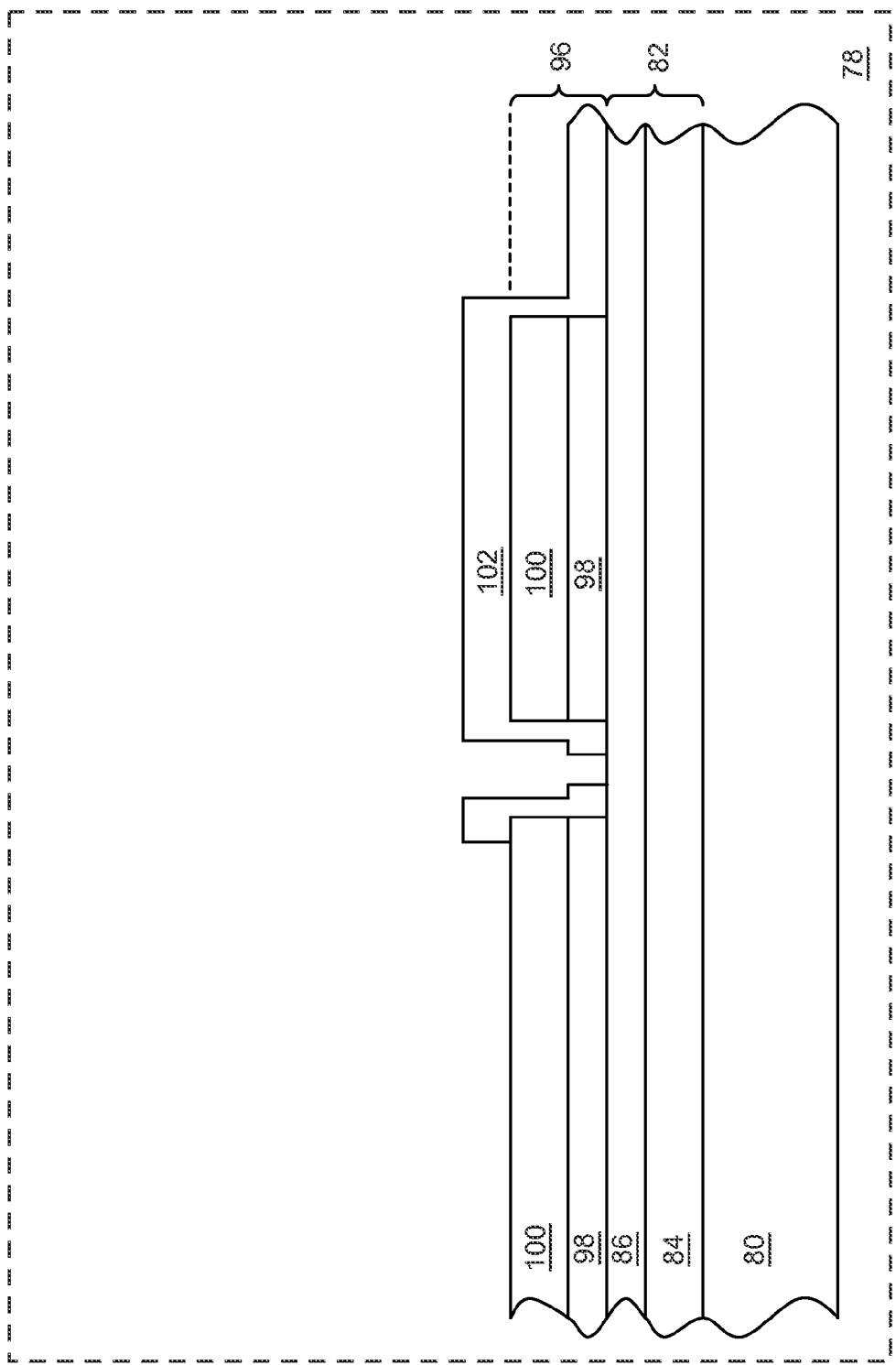
FIG. 24 shows the remnants of the third insulator layer after etching away a portion of the third insulator layer illustrated in FIG. 23.

FIG. 23 shows the third insulator layer 102 and the third patterned photoresist layer 104 added to the semiconductor die 78 illustrated in FIG. 22. The third insulator layer 102 is formed over the second metallic structural layer 100 and the second insulator layer 86. In one embodiment of the present invention, the third insulator layer 102 is deposited over the second metallic structural layer 100 using PECVD. In another embodiment of the present invention, the third insulator layer 102 is deposited over the second metallic structural layer 100 by sputtering. The third patterned photoresist layer 104 is formed over the third insulator layer 102. The third insulator layer 102 may include Silicon Nitride, Silicon Dioxide, or Aluminum Oxide. Areas of the third insulator layer 102 not covered by the third patterned photoresist layer 104 are etched away. In one embodiment of the present invention, the third insulator layer 102 is etched using RIE. FIG. 24 shows the remnants of the third insulator layer 102 after etching away a portion of the third insulator layer 102 illustrated in FIG. 23, and after removing the third patterned photoresist layer 104 after etching. Alternate embodiments of the present invention may use other ways of patterning the third insulator layer 102.

Figure 25:
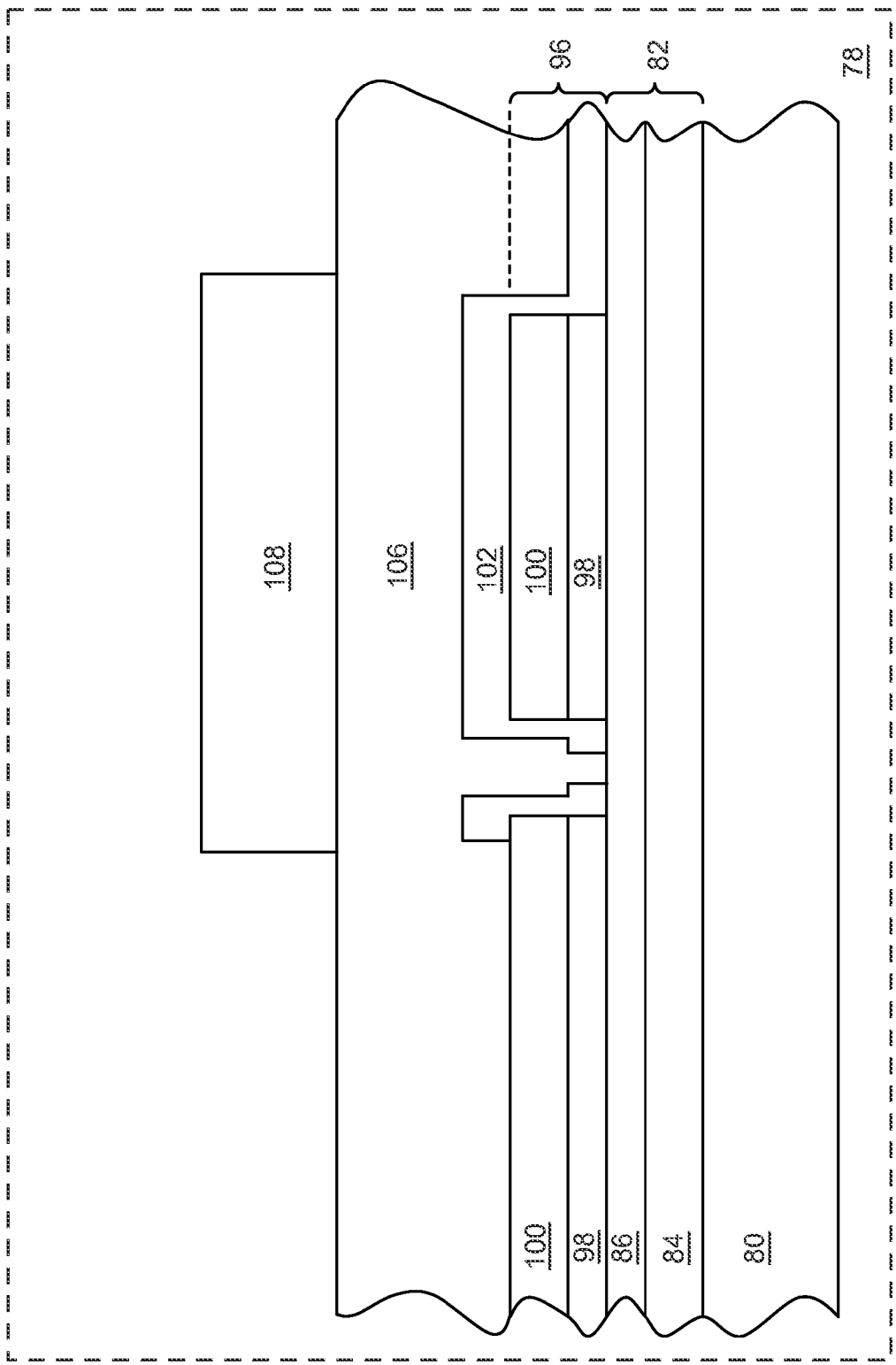
FIG. 25 shows the first sacrificial layer and the fourth patterned photoresist layer added to the semiconductor die illustrated in FIG. 24.

FIG. 25 shows the first sacrificial layer 106 and the fourth patterned photoresist layer 108 added to the semiconductor die 78 illustrated in FIG. 24. The first sacrificial layer 106 is formed over the third insulator layer 102 and the second metallic structural layer 100. The fourth patterned photoresist layer 108 is formed over the first sacrificial layer 106. The first sacrificial layer 106 will be used to provide clearance between the cantilever 42, which functions as the movable capacitive plate, and the capacitive dielectric 54 of the alternate MEMS switching capacitive element 56. Areas of the first sacrificial layer 106 not covered by the fourth patterned photoresist layer 108 are etched away. In one embodiment of the present invention, the first sacrificial layer 106 is etched using RIE. In another embodiment of the present invention, the first sacrificial layer 106 is etched using wet etching.

Figure 26:
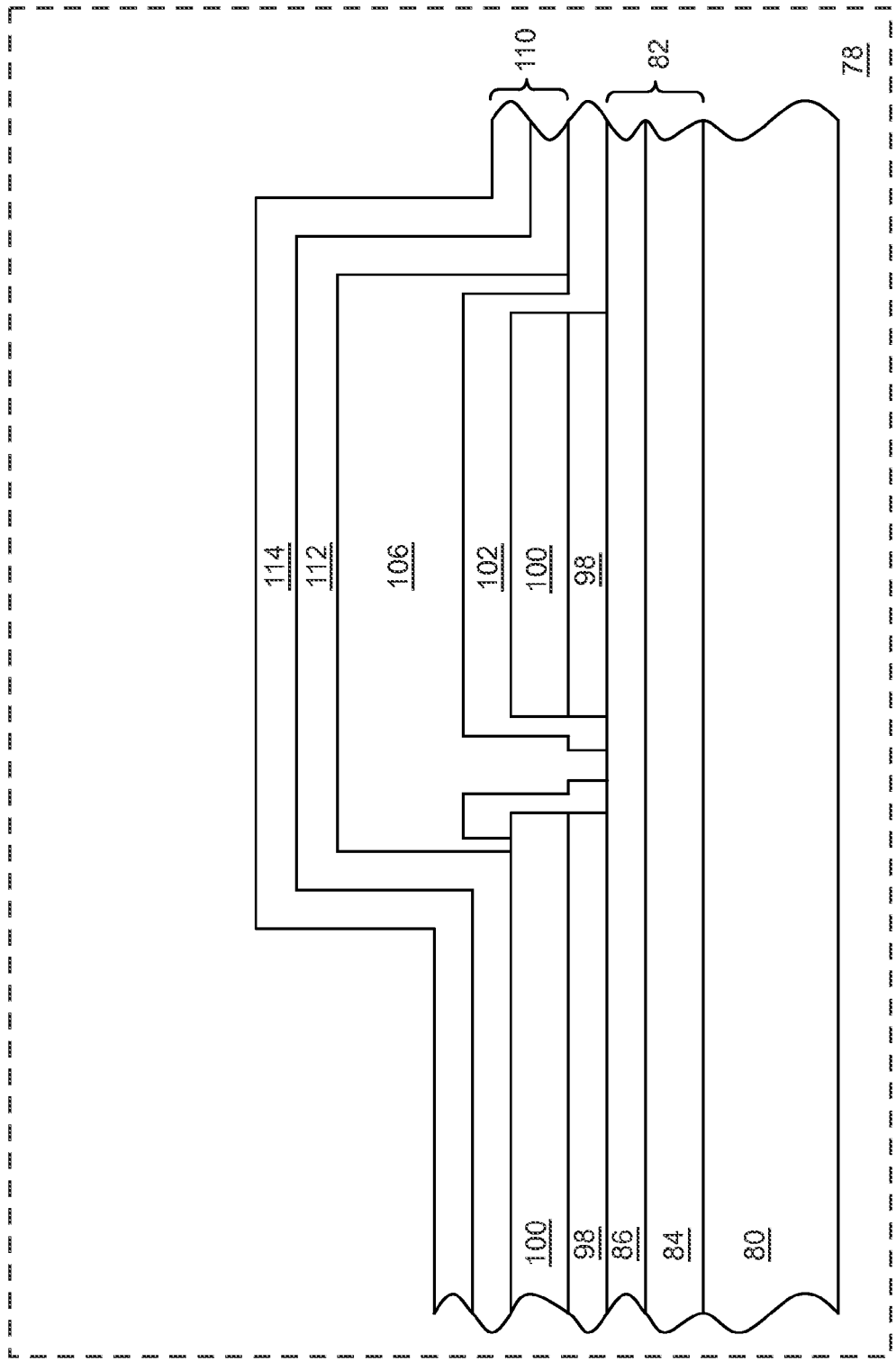
FIG. 26 shows the remnants of the first sacrificial layer after etching away a portion of the first sacrificial layer and shows the second metallization layer added to the semiconductor die illustrated in FIG. 25.

FIG. 26 shows the remnants of the first sacrificial layer 106 after etching away a portion of the first sacrificial layer 106 and shows the second metallization layer 110 added to the semiconductor die 78 illustrated in FIG. 25. The second metallization layer 110 includes the third metallic adhesion layer 112 and the third metallic structural layer 114. The third metallic adhesion layer 112 is formed over the third insulator layer 102, the second metallic structural layer 100, and the first sacrificial layer 106. The third metallic structural layer 114 is formed over the third metallic adhesion layer 112. Alternate embodiments of the present invention may use other ways of patterning the first sacrificial layer 106.

Figure 27:
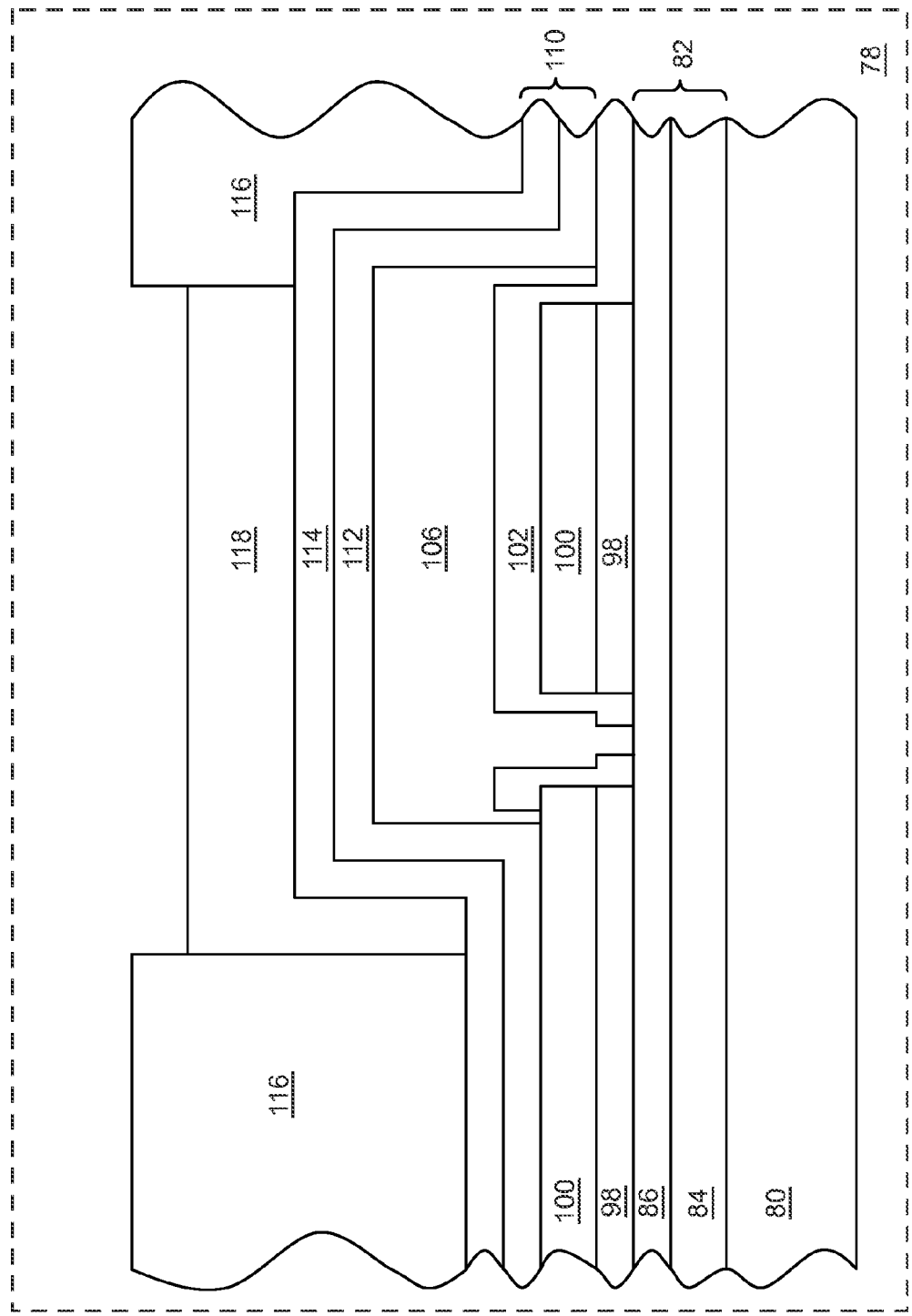
FIG. 27 shows the patterned photoresist mold and the MEMS cantilever structure layer added to the semiconductor die illustrated in FIG. 26.

FIG. 27 shows the patterned photoresist mold 116 and the MEMS cantilever structure layer 118 added to the semiconductor die 78 illustrated in FIG. 26. The patterned photoresist mold 116 is formed over the third metallic structural layer 114. The MEMS cantilever structure layer 118 is then formed over the portion of the third metallic structural layer 114 that is not covered by the patterned photoresist mold 116. The MEMS cantilever structure layer 118 may be formed over the third metallic structural layer 114 by electroplating or by another technique. The second metallization layer 110 may function as a seed layer for the MEMS cantilever structure layer 118. After the MEMS cantilever structure layer 118 is formed, the patterned photoresist mold 116 is removed.

Figure 28:
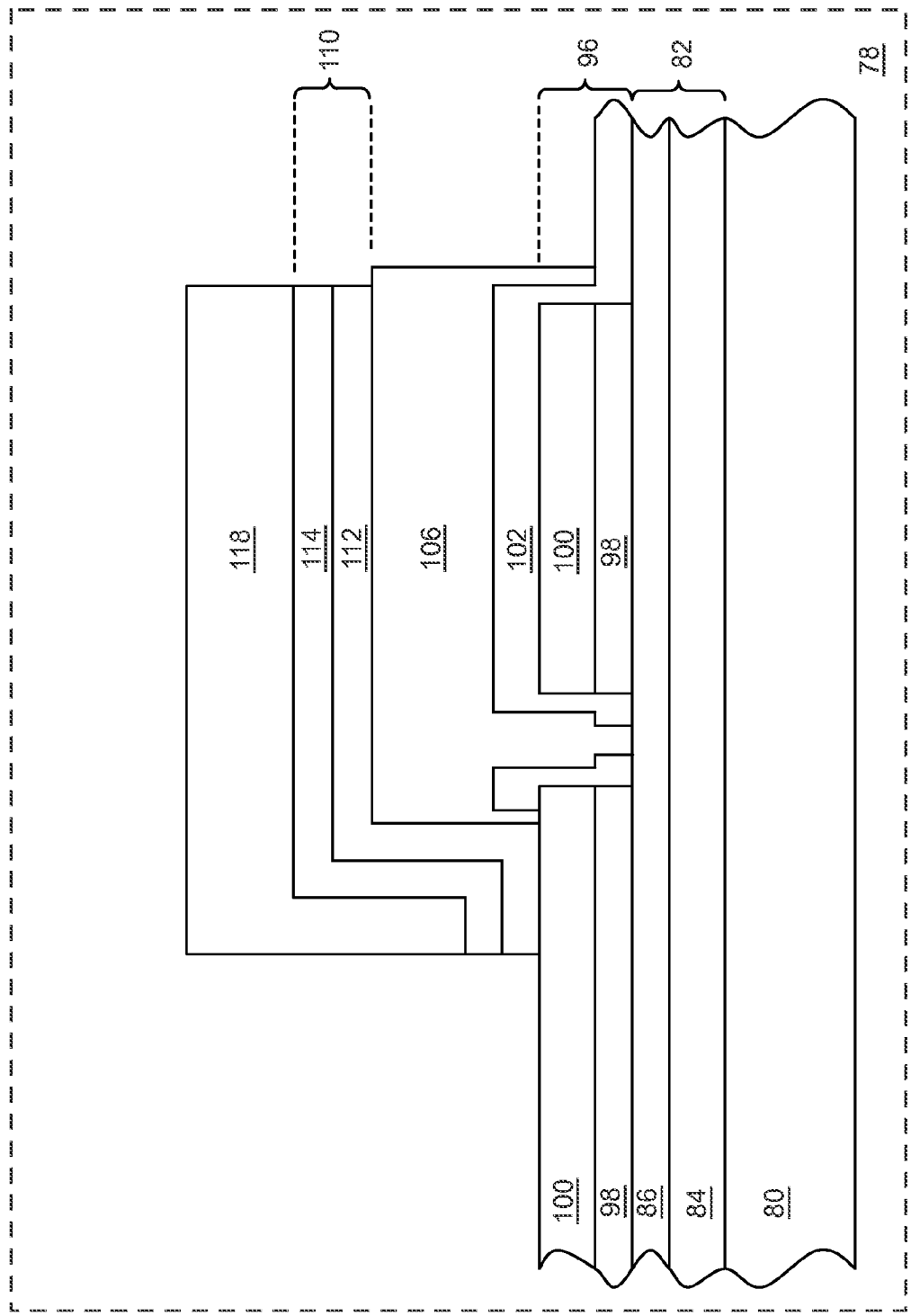
FIG. 28 shows the remnants of the second metallization layer and the MEMS cantilever structure layer after etching away a portion of the second metallization layer and the MEMS cantilever structure layer illustrated in FIG. 27.
Figure 29:
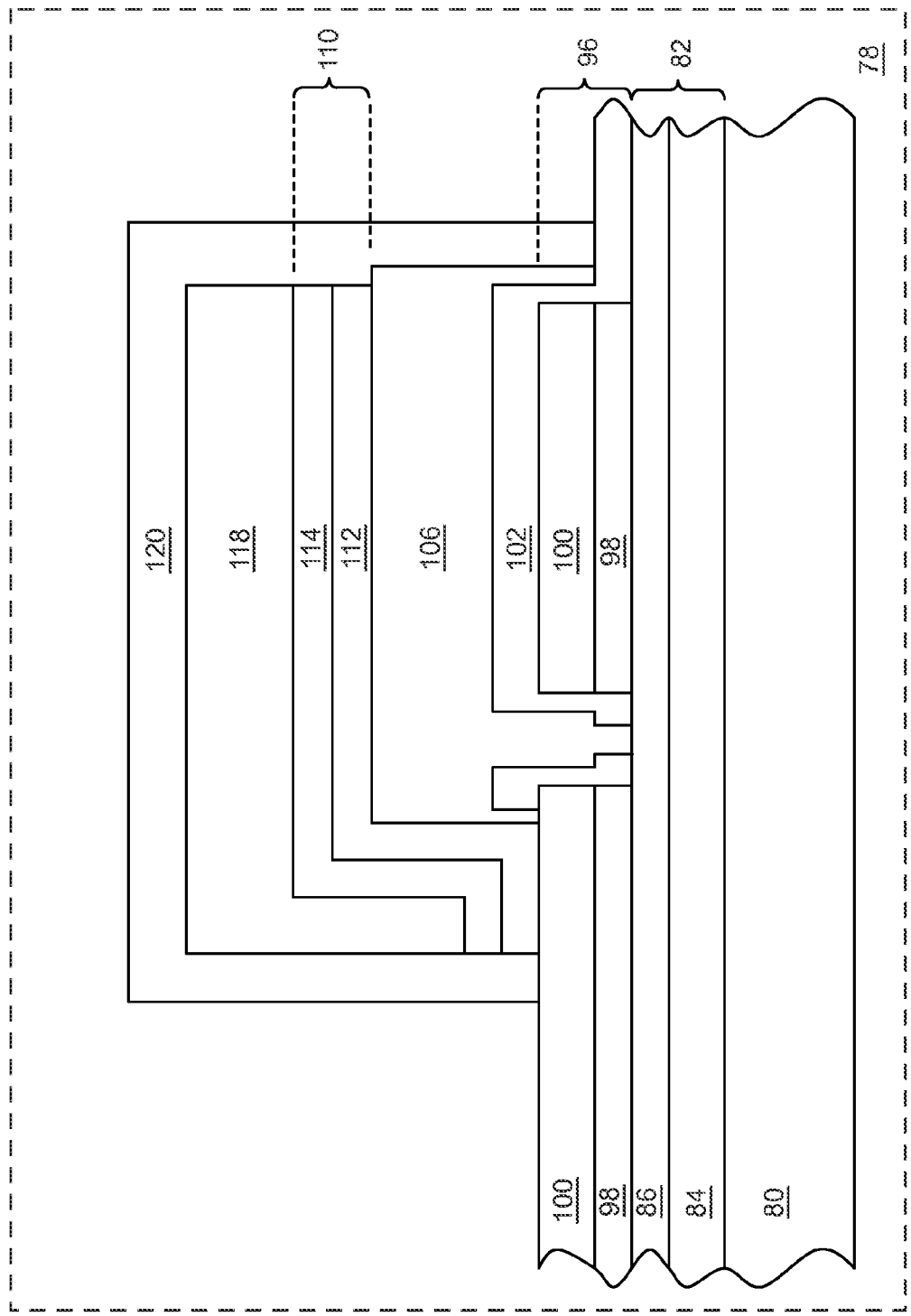
FIG. 29 shows the second sacrificial layer after patterning and etching added to the semiconductor die illustrated in FIG. 28.

FIG. 28 shows the remnants of the second metallization layer 110 and the MEMS cantilever structure layer 118 after etching away a portion of the second metallization layer 110 and the MEMS cantilever structure layer 118 illustrated in FIG. 27. In one embodiment of the present invention, the third insulator layer 102 protects the first metallization layer 96 from being undercut as a result of etching the second metallization layer 110. FIG. 29 shows the patterned second sacrificial layer 120 added to the semiconductor die 78 illustrated in FIG. 28. The patterned second sacrificial layer 120 is formed over the MEMS cantilever structure layer 118, the third metallic structural layer 114, the third metallic adhesion layer 112, the first sacrificial layer 106, the third insulator layer 102, and the second metallic structural layer 100.

Figure 30:
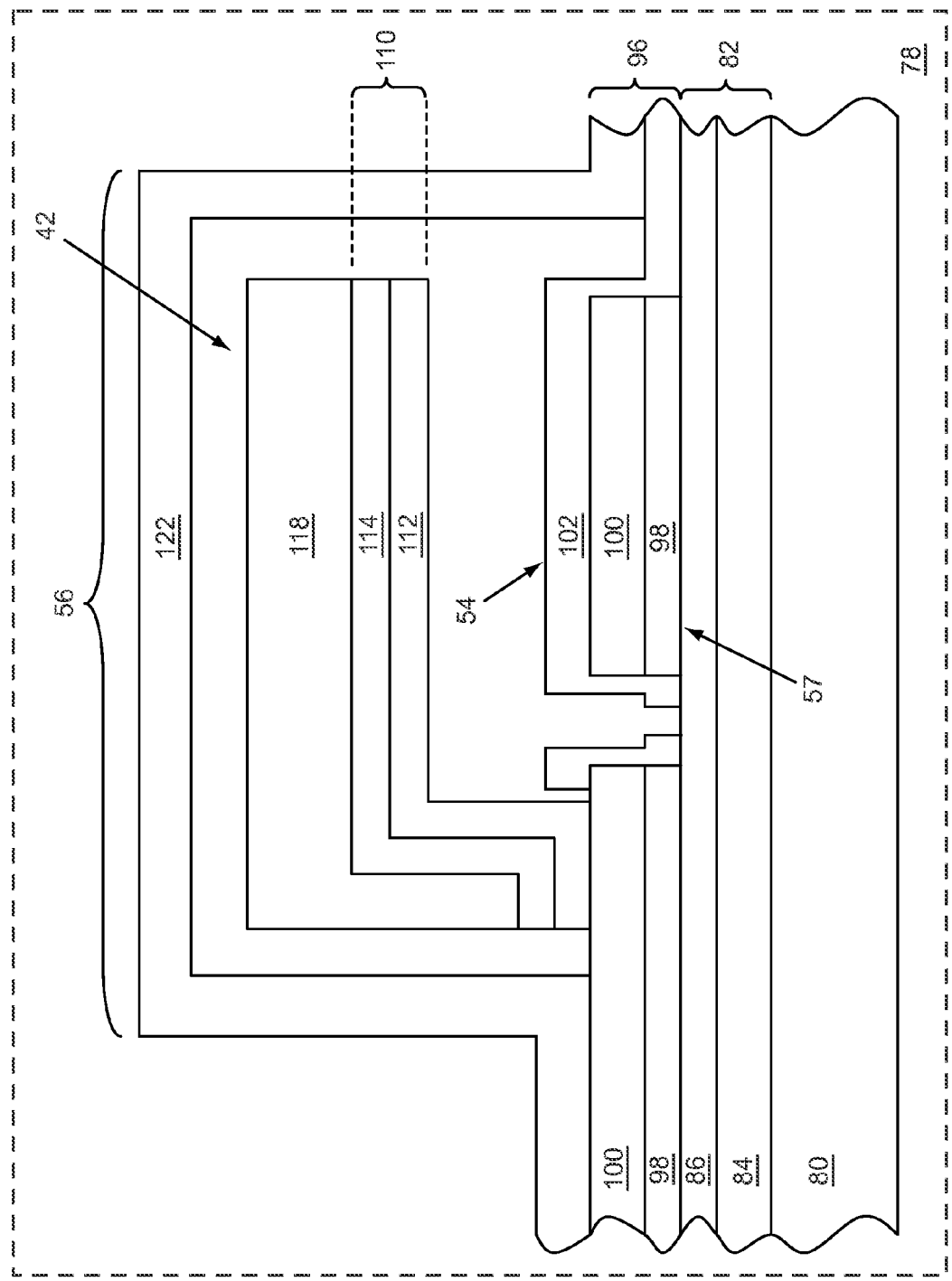
FIG. 30 shows the dome layer added to the semiconductor die illustrated in FIG. 29 to provide the first MEMS switching capacitive element.

FIG. 30 shows the dome layer 122 added to the semiconductor die 78 illustrated in FIG. 29 to provide the alternate MEMS switching capacitive element 56. The dome layer 122 is formed over the patterned second sacrificial layer 120 to provide a dome for the alternate MEMS switching capacitive element 56. The first sacrificial layer 106 and the patterned second sacrificial layer 120 were evacuated to provide space for the alternate MEMS switching capacitive element 56 to operate freely. The first sacrificial layer 106 and the patterned second sacrificial layer 120 may have been evacuated through evacuation passages, holes, or both in the dome layer 122, in the third insulator layer 102, in the first metallization layer 96, or any combination thereof. The dome layer 122 may include insulating material or conducting material. In one embodiment of the present invention, the dome layer 122 is conducting and the third insulator layer 102 electrically insulates the dome layer 122 from the first metallization layer 96.

The MEMS cantilever structure layer 118, the third metallic structural layer 114, and the third metallic adhesion layer 112 provide the cantilever 42, which functions as the movable capacitive plate. The first metallization layer 96 provides the combined actuator and fixed capacitive plate 57 and the third insulator layer 102 provides the capacitive dielectric 54. The first terminal 44 (FIG. 4B) is electrically coupled to the combined actuator and fixed capacitive plate 57 through the first metallization layer 96. The second terminal 48 (FIG. 4B) is electrically coupled to the cantilever 42 through the second metallization layer 110.

In alternate embodiments of the alternate MEMS switching capacitive element 56, a non-cantilever architecture may be used, a different movable member instead of the cantilever 42 may be used, the movable capacitive plate, the combined actuator and fixed capacitive plate 57, the capacitive dielectric 54, or any combination thereof may be provided using a different architecture. Additional layers may be included in any order. Any of the first insulator layer 84, the second insulator layer 86, the first metallic adhesion layer 90, the first metallic structural layer 92, the second metallic adhesion layer 98, the second metallic structural layer 100, the third metallic adhesion layer 112, the third metallic structural layer 114, the MEMS cantilever structure layer 118, and the dome layer 122 may be omitted.

In another embodiment of the present invention, the semiconductor die 78 may provide the first MEMS switching capacitive element 40 by separating the combined actuator and fixed capacitive plate 57 illustrated in FIG. 30 into a separate actuator 50 and fixed capacitive plate 46.

Figure 31:
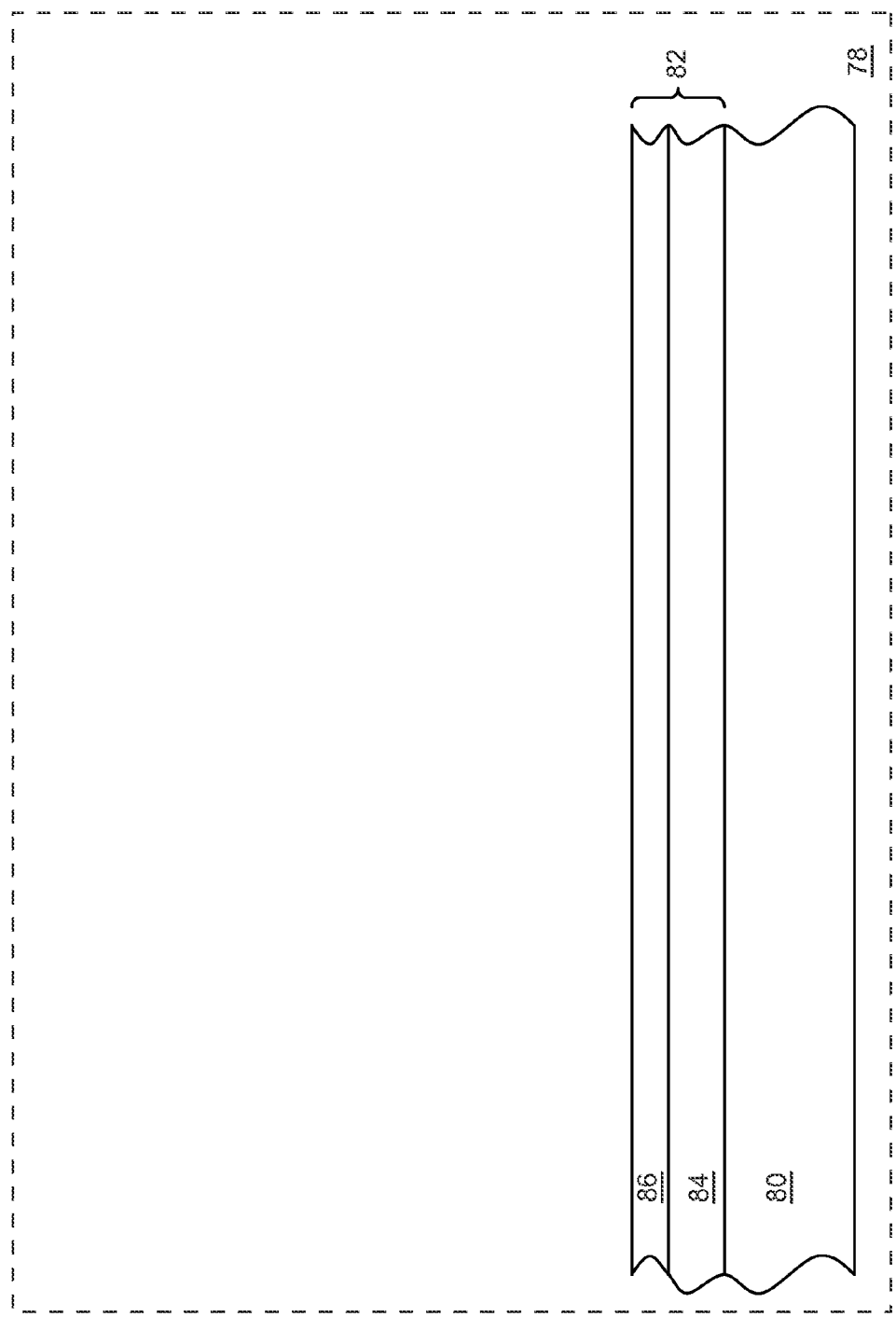
FIG. 31 shows a third region of the semiconductor die, according to one embodiment of the present invention.

FIG. 31 shows a third region of the semiconductor die 78, according to one embodiment of the present invention. The semiconductor die 78 includes the substrate 80, which may be a semiconductor substrate, such as Silicon. The substrate insulator layer 82 is over the substrate 80 and includes the first insulator layer 84 and the second insulator layer 86. The first insulator layer 84 may include Silicon Nitride and the second insulator layer 86 may include Silicon Dioxide. In alternate embodiments of the present invention, the substrate insulator layer 82 may be a single layer, may include multiple layers, the first insulator layer 84 may include other insulating material, the second insulator layer 86 may include other insulating material, or any combination thereof.

Figure 32:
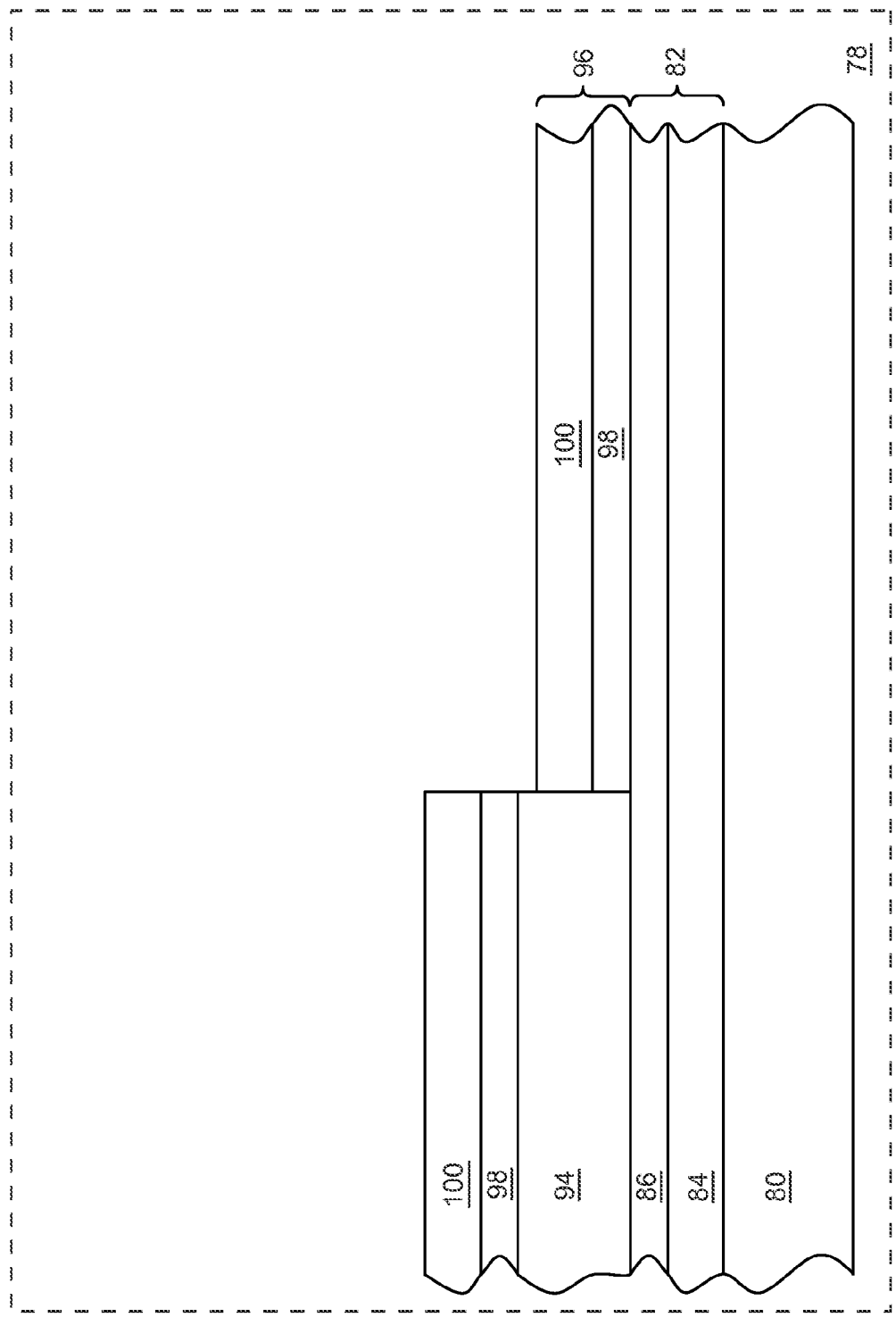
FIG. 32 shows the second patterned photoresist layer and the first metallization layer added to the semiconductor die illustrated in FIG. 31.

FIG. 32 shows the second patterned photoresist layer 94 and the first metallization layer 96 added to the semiconductor die 78 illustrated in FIG. 31. The first metallization layer 96 includes the second metallic adhesion layer 98 and the second metallic structural layer 100. The second patterned photoresist layer 94 is formed over the second insulator layer 86. The second metallic adhesion layer 98 is formed over the second patterned photoresist layer 94 and the second insulator layer 86. The second metallic structural layer 100 is formed over the second metallic adhesion layer 98. The second metallic adhesion layer 98 may include Titanium, Chromium, Titanium Tungsten alloy, or other suitable material, and is used to bond the second metallic structural layer 100 to the substrate insulator layer 82. The second metallic structural layer 100 may include Gold, Copper, or Aluminum. In alternate embodiments of the present invention, the first metallization layer 96 may be a single layer, may include multiple layers, the second metallic adhesion layer 98 may include other conductive material, the second metallic structural layer 100 may include other conductive material, or any combination thereof.

Figure 33:
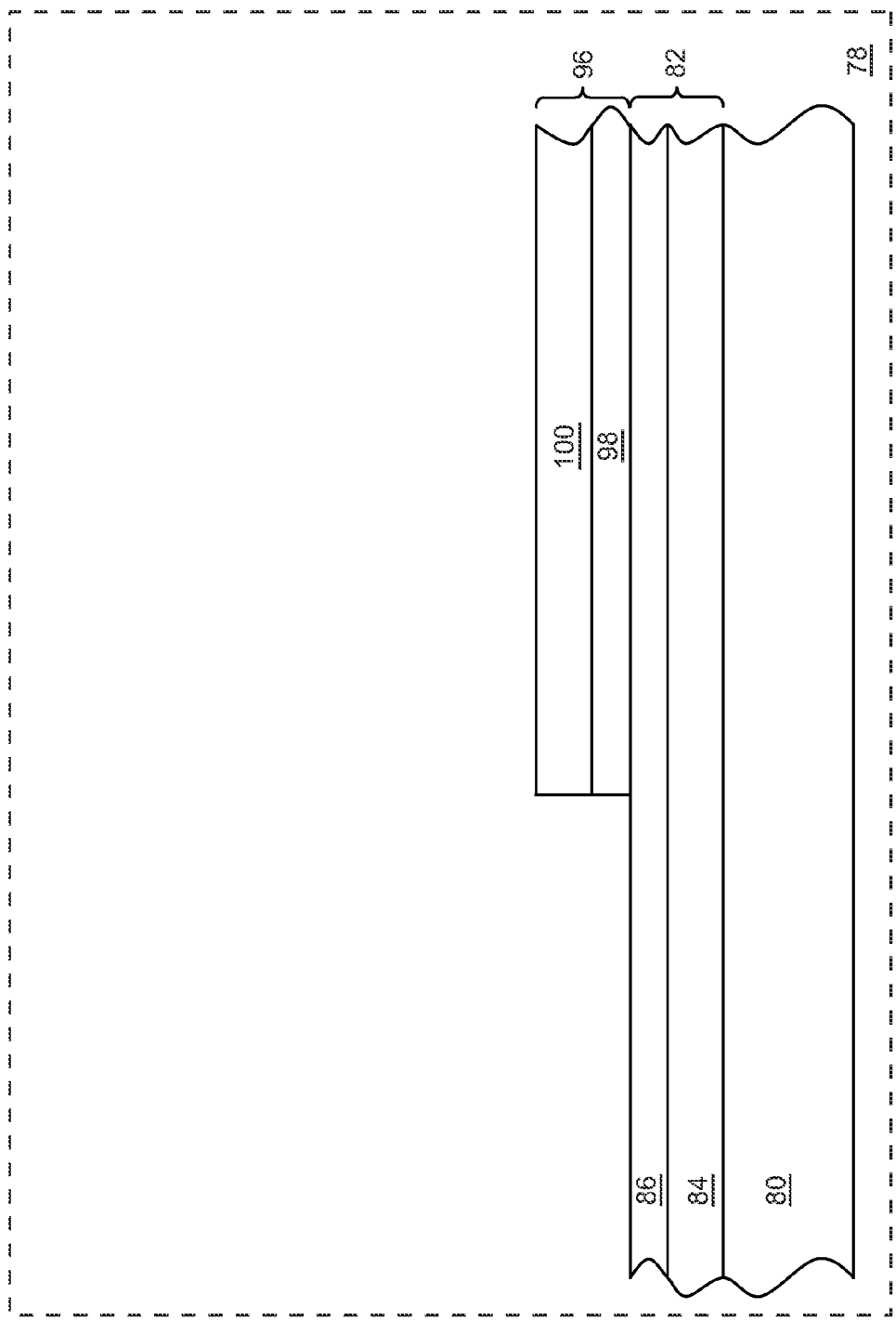
FIG. 33 shows the remnants of the first metallization layer after lifting-off the portion of the first metallization layer that was formed over the second patterned photoresist layer as illustrated in FIG. 32.

FIG. 33 shows the remnants of the first metallization layer 96 after lifting-off the portion of the first metallization layer 96 that was formed over the second patterned photoresist layer 94 as illustrated in FIG. 32. Alternate embodiments of the present invention may use other techniques to pattern the first metallization layer 96, such as using a single layer to provide the first metallization layer 96, using other methods of patterning the second metallic adhesion layer 98, using other methods of patterning the second metallic structural layer 100, or the like.

Figure 34:
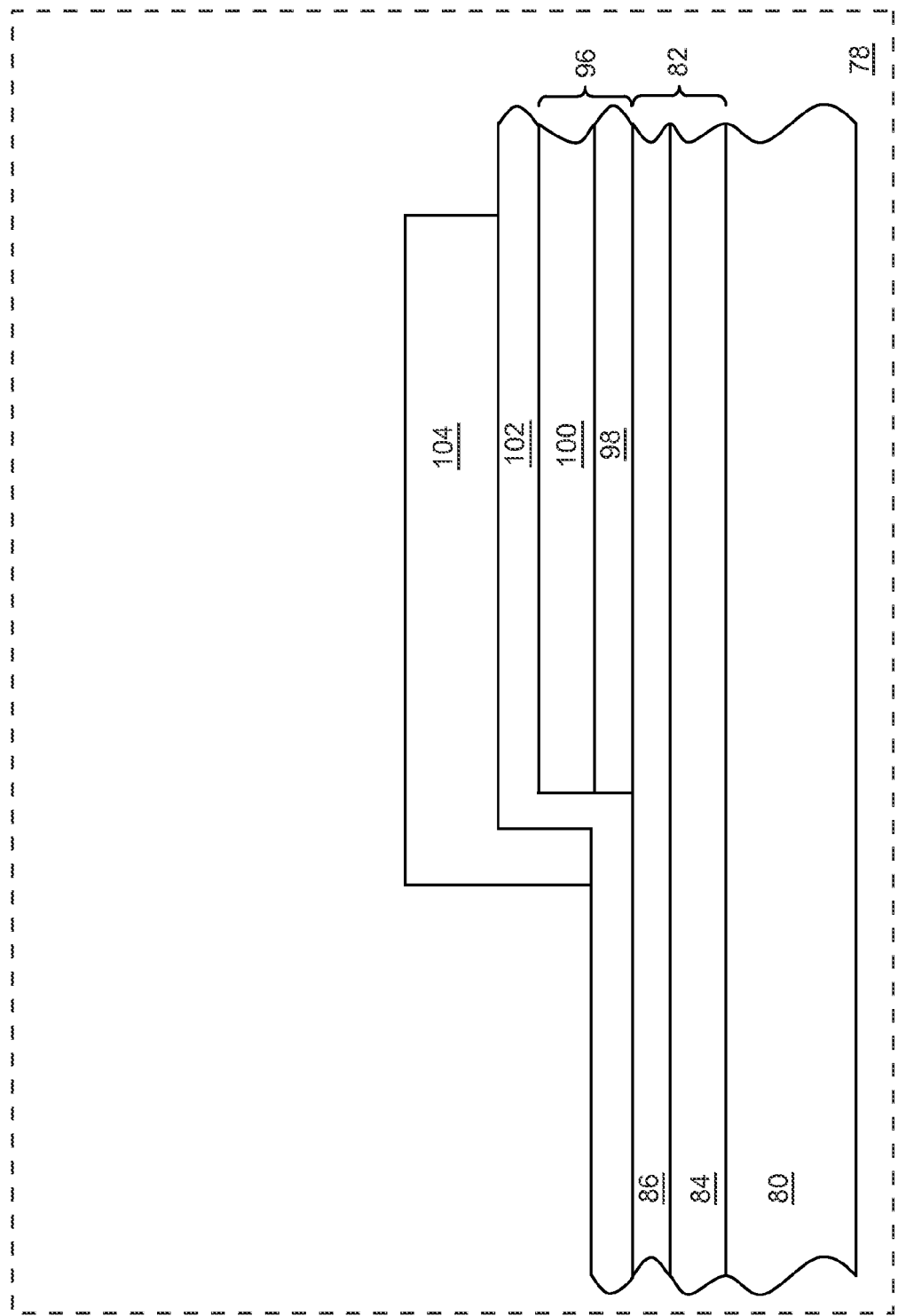
FIG. 34 shows the third insulator layer and the third patterned photoresist layer added to the semiconductor die illustrated in FIG. 33.
Figure 35:
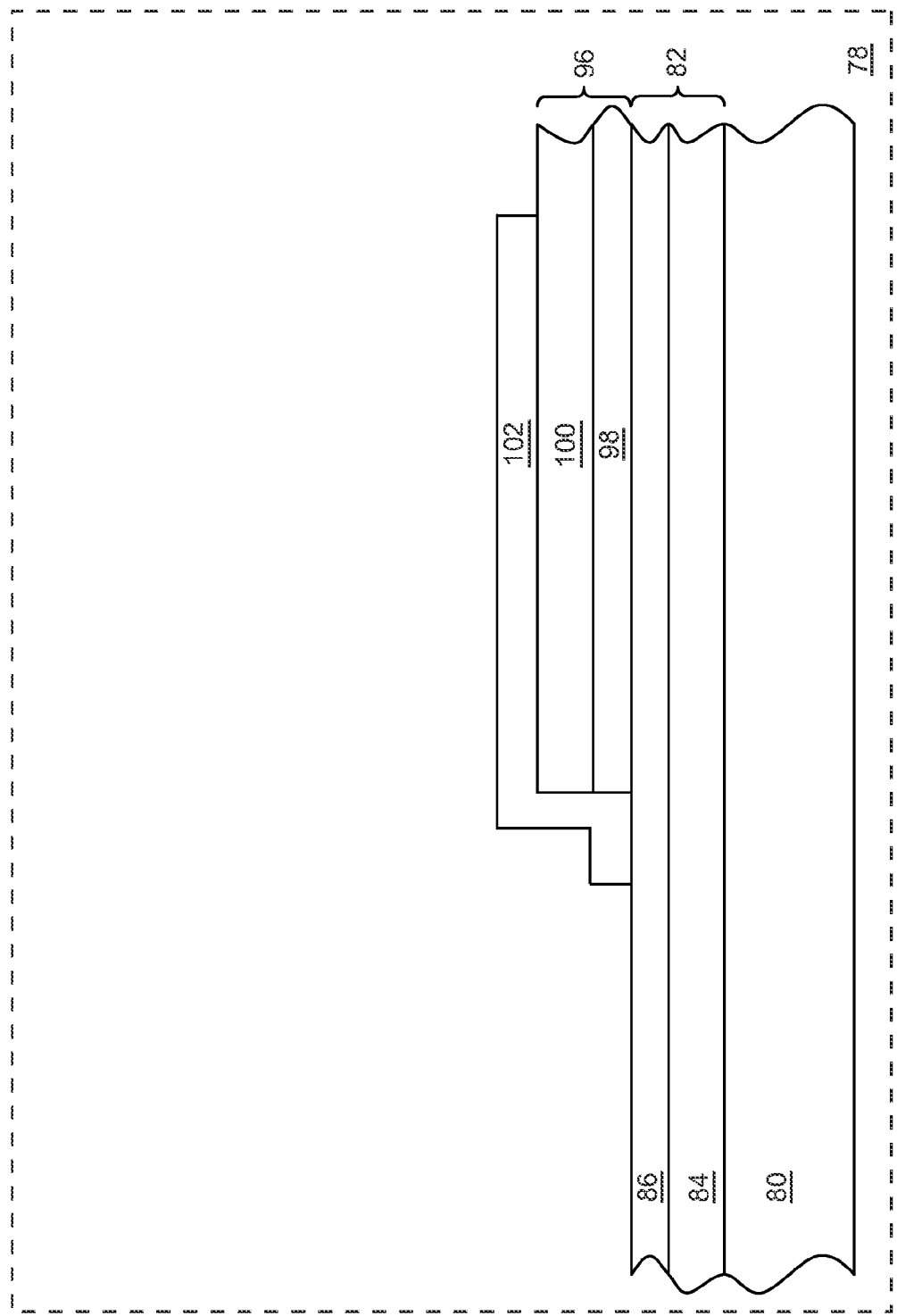
FIG. 35 shows the remnants of the third insulator layer after etching away a portion of the third insulator layer illustrated in FIG. 34.

FIG. 34 shows the third insulator layer 102 and the third patterned photoresist layer 104 added to the semiconductor die 78 illustrated in FIG. 33. The third insulator layer 102 is formed over the second metallic structural layer 100 and the second insulator layer 86. In one embodiment of the present invention, the third insulator layer 102 is deposited over the second metallic structural layer 100 using PECVD. In another embodiment of the present invention, the third insulator layer 102 is deposited over the second metallic structural layer 100 by sputtering. The third patterned photoresist layer 104 is formed over the third insulator layer 102. The third insulator layer 102 may include Silicon Nitride, Silicon Dioxide, or Aluminum Oxide. Areas of the third insulator layer 102 not covered by the third patterned photoresist layer 104 are etched away. In one embodiment of the present invention, the third insulator layer 102 is etched using RIE. FIG. 35 shows the remnants of the third insulator layer 102 after etching away a portion of the third insulator layer 102 illustrated in FIG. 34, and after removing the third patterned photoresist layer 104 after etching. Alternate embodiments of the present invention may use other ways of patterning the third insulator layer 102.

Figure 36:
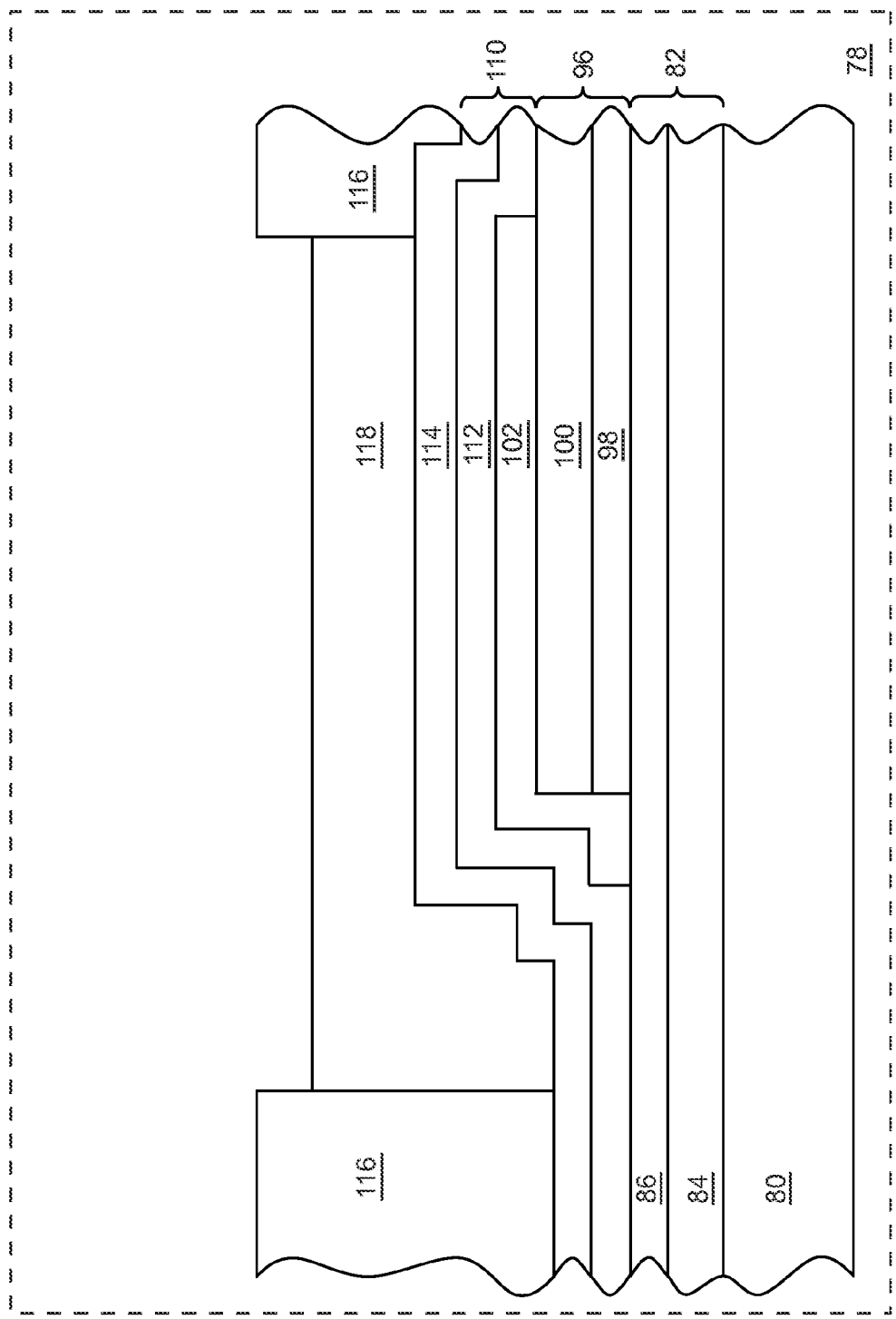
FIG. 36 shows the patterned photoresist mold and the MEMS cantilever structure layer added to the semiconductor die illustrated in FIG. 35.

FIG. 36 shows the second metallization layer 110, the patterned photoresist mold 116, and the MEMS cantilever structure layer 118 added to the semiconductor die 78 illustrated in FIG. 35. The second metallization layer 110 includes the third metallic adhesion layer 112 and the third metallic structural layer 114. The third metallic adhesion layer 112 is formed over the third insulator layer 102, the second metallic structural layer 100, and the second insulator layer 86. The third metallic structural layer 114 is formed over the third metallic adhesion layer 112. The patterned photoresist mold 116 is formed over the third metallic structural layer 114. The MEMS cantilever structure layer 118 is then formed over the portion of the third metallic structural layer 114 that is not covered by the patterned photoresist mold 116. The MEMS cantilever structure layer 118 may be formed over the third metallic structural layer 114 by electroplating or by another technique. The second metallization layer 110 may function as a seed layer for the MEMS cantilever structure layer 118. After the MEMS cantilever structure layer 118 is formed, the patterned photoresist mold 116 is removed.

Figure 37:
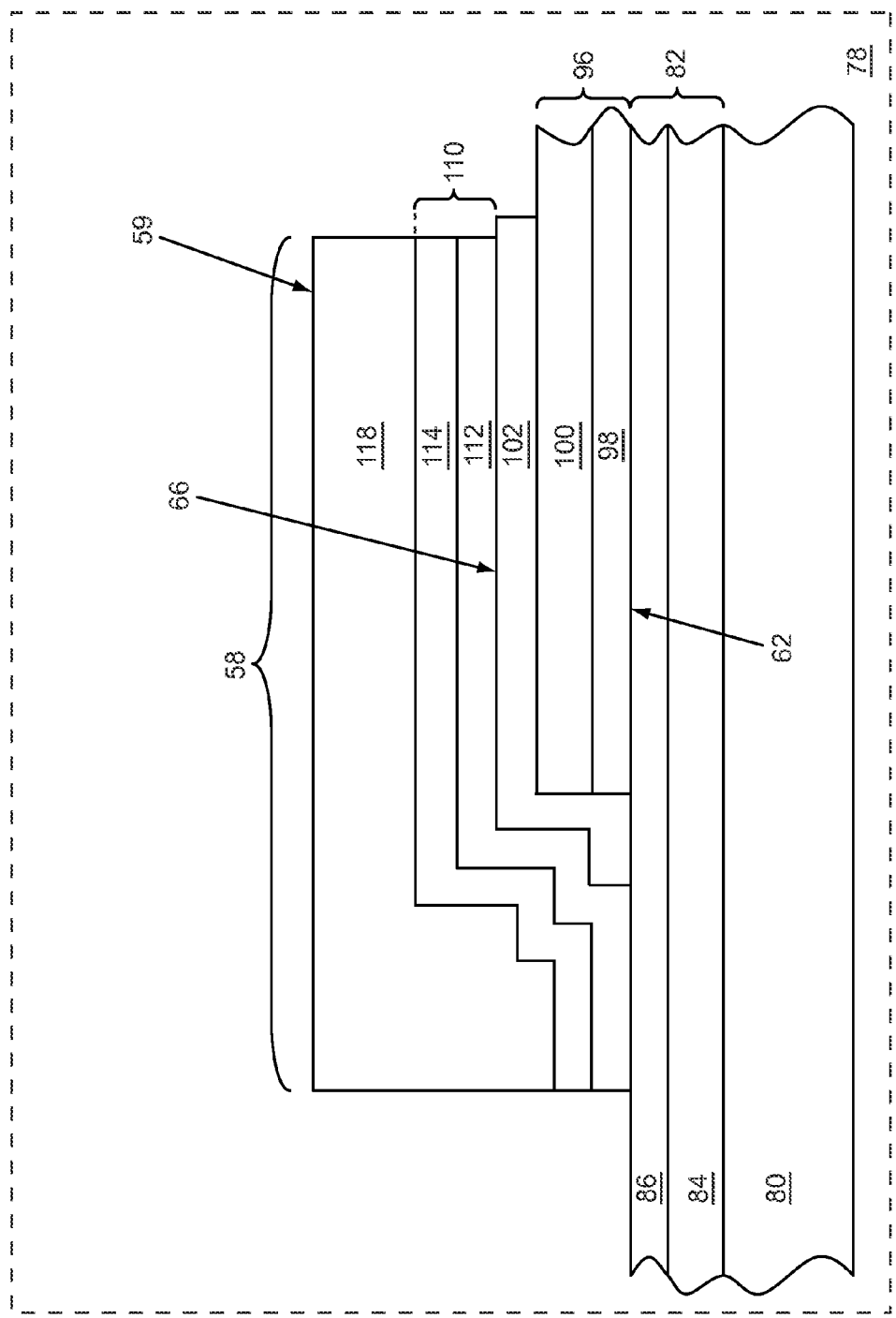
FIG. 37 shows the remnants of the second metallization layer and the MEMS cantilever structure layer after etching away a portion of the second metallization layer and the MEMS cantilever structure layer illustrated in FIG. 36 to provide the first integrated fixed capacitive element.

FIG. 37 shows the remnants of the second metallization layer 110 and the MEMS cantilever structure layer 118 after etching away a portion of the second metallization layer 110 and the MEMS cantilever structure layer 118 illustrated in FIG. 36 to provide the first integrated fixed capacitive element 58. The MEMS cantilever structure layer 118, the third metallic structural layer 114, and the third metallic adhesion layer 112 provide the first capacitive plate 59. The first metallization layer 96 provides the second capacitive plate 62, and the third insulator layer 102 provides the fixed dielectric 66, which is between the first and second capacitive plates 59, 62. The first capacitive plate 59 is electrically coupled to the first terminal 60 (FIG. 4C) through the first metallization layer 96, and the second capacitive plate 62 is electrically coupled to the second terminal 64 (FIG. 4C) through the second metallization layer 110.

In alternate embodiments of the first integrated fixed capacitive element 58, the first capacitive plate 59, the first terminal 60, the second capacitive plate 62, the second terminal 64, the fixed dielectric 66, or any combination thereof may be provided using a different architecture. Additional layers may be included in any order. Any of the first insulator layer 84, the second insulator layer 86, the second metallic adhesion layer 98, the second metallic structural layer 100, the third metallic adhesion layer 112, the third metallic structural layer 114, and the MEMS cantilever structure layer 118, may be omitted.

Figure 38:
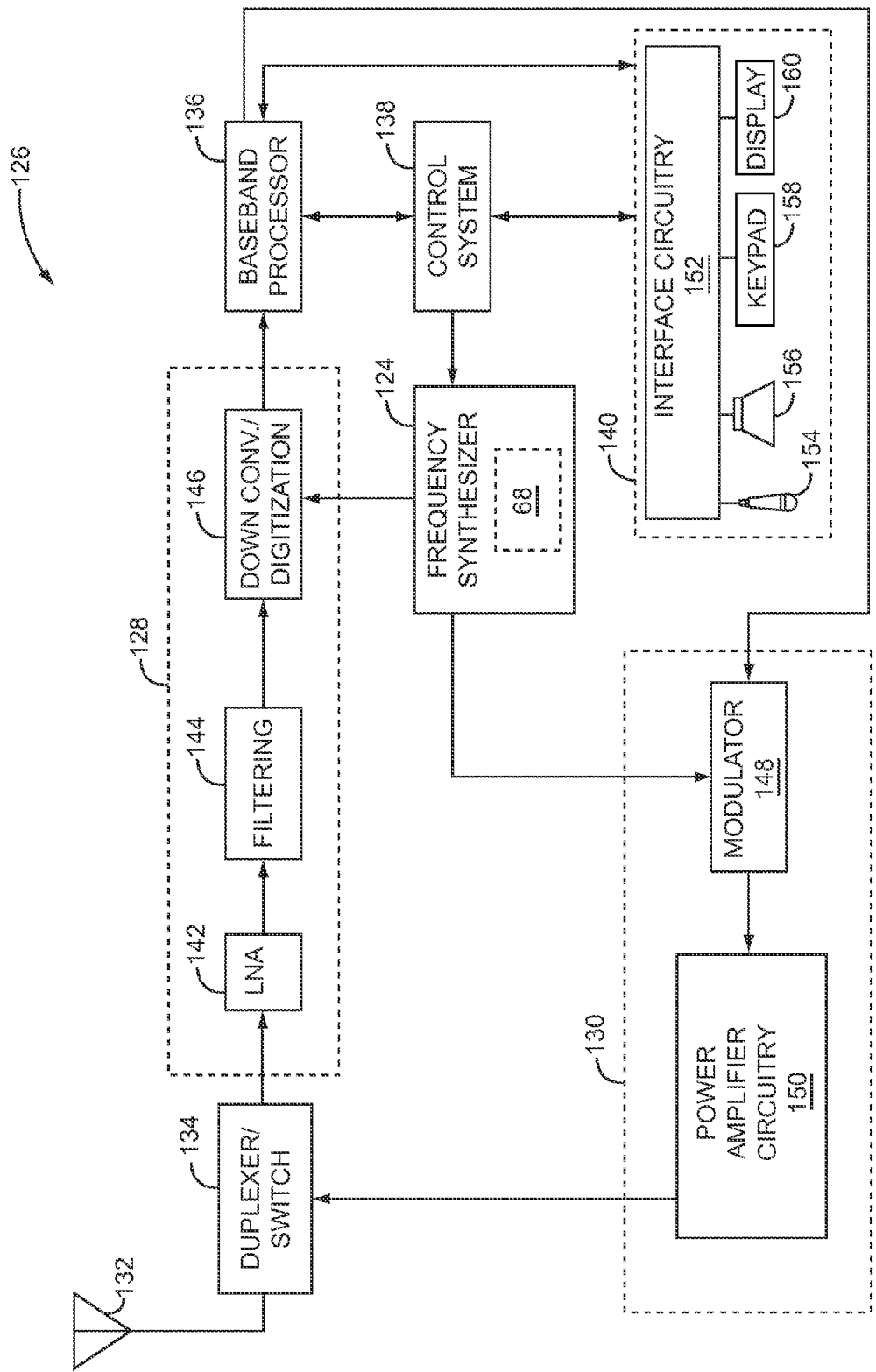
FIG. 38 shows an application example of the present invention used in a mobile terminal.

An application example of an integrated selectable capacitor bank 68 is its use in a frequency synthesizer 124 in a mobile terminal 126, the basic architecture of which is represented in FIG. 38. The mobile terminal 126 may include a receiver front end 128, a radio frequency transmitter section 130, an antenna 132, a duplexer or switch 134, a baseband processor 136, a control system 138, the frequency synthesizer 124, and an interface 140. The receiver front end 128 receives information bearing radio frequency signals from one or more remote transmitters provided by a base station (not shown). A low noise amplifier (LNA) 142 amplifies the signal. A filter circuit 144 minimizes broadband interference in the received signal, while down conversion and digitization circuitry 146 down converts the filtered, received signal to an intermediate or baseband frequency signal, which is then digitized into one or more digital streams. The receiver front end 128 typically uses one or more mixing frequencies generated by the frequency synthesizer 124. The baseband processor 136 processes the digitized received signal to extract the information or data bits conveyed in the received signal. This processing typically comprises demodulation, decoding, and error correction operations. As such, the baseband processor 136 is generally implemented in one or more digital signal processors (DSPs).

On the transmit side, the baseband processor 136 receives digitized data, which may represent voice, data, or control information, from the control system 138, which it encodes for transmission. The encoded data is output to the transmitter 130, where it is used by a modulator 148 to modulate a carrier signal that is at a desired transmit frequency. Power amplifier circuitry 150 amplifies the modulated carrier signal to a level appropriate for transmission, and delivers the amplified and modulated carrier signal to the antenna 132 through the duplexer or switch 134.

A user may interact with the mobile terminal 126 via the interface 140, which may include interface circuitry 152 associated with a microphone 154, a speaker 156, a keypad 158, and a display 160. The interface circuitry 152 typically includes analog-to-digital converters, digital-to-analog converters, amplifiers, and the like. Additionally, it may include a voice encoder/decoder, in which case it may communicate directly with the baseband processor 136. The microphone 154 will typically convert audio input, such as the user's voice, into an electrical signal, which is then digitized and passed directly or indirectly to the baseband processor 136. Audio information encoded in the received signal is recovered by the baseband processor 136, and converted by the interface circuitry 152 into an analog signal suitable for driving the speaker 156. The keypad 158 and display 160 enable the user to interact with the mobile terminal 126, input numbers to be dialed, address book information, or the like, as well as monitor call progress information.

Those skilled in the art will recognize improvements and modifications to the preferred embodiments of the present invention. All such improvements and modifications are considered within the scope of the concepts disclosed herein and the claims that follow.

What is claimed is:
1. A method to simultaneously form a micro-electromechanical systems (MEMS) switch and a MEMS fixed capacitor comprising:
providing a substrate;
forming a first insulator layer over the substrate;

forming a contact bump structure of a fixed contact of the MEMS switch from a first structural metallization layer, wherein the first structural metallization layer is over the first insulator layer;

forming an actuator of the MEMS switch, a first capacitive plate of the MEMS fixed capacitor, and a contact portion of the fixed contact of the MEMS switch with a first metallization layer, wherein the first metallization layer is over a portion of the first insulator layer and the contact bump structure;

forming an actuator insulator of the MEMS switch and a fixed dielectric layer of the MEMS fixed capacitor with a second insulator layer, wherein the second insulator layer is over a portion of the first metallization layer and a portion of the first insulator layer;

forming a first portion of a movable contact of the MEMS switch and a first portion of a second capacitive plate of the MEMS fixed capacitor with a second metallization layer, wherein the second metallization layer is over a portion of the first metallization layer, the actuator insulator, and the fixed contact of the MEMS switch, and wherein the second metallization layer is over a the fixed dielectric layer of the MEMS fixed capacitor;

forming a second portion of the movable contact of the MEMS switch and a second portion of the second capacitive plate of the MEMS fixed capacitor with a cantilever structure layer, wherein the cantilever structure layer is over portion of the second metallization layer.

2. The method of claim 1 further comprising:
forming a dome of the MEMS switch with a dome layer, wherein the dome layer is over and about the moveable contact of the MEMS switch, the fixed contact of the MEMS switch, and the actuator of the MEMS switch.

3. The method of claim 2 wherein the dome layer includes an insulating material.

4. The method of claim 2 wherein the dome layer includes a conducting material.

5. The method of claim 1 wherein forming the first insulator layer over the substrate comprises:
forming the first insulator layer with a plurality of insulator layers.

6. The method of claim 1 wherein forming the contact bump structure of the fixed contact of the MEMS switch from the first structural metallization layer, wherein the first structural metallization layer is over the first insulator layer; comprises:
forming a first patterned photoresist layer over the first insulator layer;
forming a first metallic adhesion layer over the first patterned photoresist layer and the first insulator layer;
forming a first metallic structure layer over the first metallic adhesion layer; and
lifting off a portion of the first metallic adhesion layer and the first metallic structure layer that were formed over the first patterned photoresist layer to provide the contact bump structure of the fixed contact of the MEMS switch.

7. The method of claim 6 wherein the first metallic adhesion layer includes one of a group consisting of titanium, chromium, and a titanium tungsten alloy.

8. The method of claim 6 wherein the first metallic structure layer includes one of a group consisting of gold, copper, and aluminum.

9. The method of claim 1 wherein forming the actuator of the MEMS switch, the first capacitive plate of the MEMS fixed capacitor, and the contact portion of the fixed contact of the MEMS switch with the first metallization layer, wherein the first metallization layer is over the portion of the first insulator layer and the contact bump structure comprises:
forming a second patterned photoresist layer over the first insulator layer;
forming a second metallic adhesion layer over the first insulator layer, the first patterned photoresist layer, and the contact bump structure;
forming a second metallic structural layer over the second metallic adhesion layer; and
forming the contact portion of the fixed contact of the MEMS switch, the actuator of the MEMS switch, and the first capacitive plate of the MEMS fixed capacitor by lifting off a portion of the second metallic adhesion layer and the second metallic structural layer that were formed over the second patterned photoresist layer.

10. The method of claim 9 wherein the second metallic adhesion layer includes one of a group consisting of titanium, chromium, and a titanium tungsten alloy.

11. The method of claim 9 wherein the second metallic structural layer includes one of a group consisting of gold, copper, and aluminum.

12. The method of claim 1 wherein forming the actuator insulator of the MEMS switch and the fixed dielectric layer of the MEMS fixed capacitor with the second insulator layer, wherein the second insulator layer is over the portion of the first metallization layer and the portion of the first insulator layer comprises:
forming the second insulator layer by sputtering a second insulator material over the first metallization layer and the first insulator layer; and
forming the actuator insulator of the MEMS switch and the fixed dielectric layer of the MEMS fixed capacitor by removing portions of the second insulator material of the second insulator layer.

13. The method of claim 1 wherein the second metallization layer includes a third metallic structural layer; and
wherein forming the first portion of the moveable contact of the MEMS switch and the first portion of the second capacitive plate of the MEMS fixed capacitor with the second metallization layer comprises:
forming the second metallization layer over a portion a portion of the second insulator layer, the actuator insulator and the fixed contact of the MEMS switch and the first portion of the second capacitive plate of the MEMS fixed capacitor.

14. The method of claim 1 wherein forming the second portion of the moveable contact of the MEMS switch and the second portion of the second capacitive plate of the MEMS fixed capacitor with the cantilever structure layer further comprises:
forming a patterned photoresist mold over a protected portion of the third metallic structural layer; and
forming the first portion of the moveable contact of the MEMS switch and the first portion of the second capacitive plate of the MEMS fixed capacitor over an exposed portion of the third metallic structural layer with an electroplating technique.

15. The method of claim 14 wherein forming the first portion of the moveable contact of the MEMS switch and the first portion of the second capacitive plate of the MEMS fixed capacitor over the exposed portion of the third metallic structural layer with the electroplating technique comprises:
removing the patterned photoresist mold over the protected portion of the third metallic structural layer.

16. A micro-electromechanical systems (MEMS) switch and a MEMS fixed capacitor formed simultaneously comprising:
a substrate;
a first insulator layer formed over the substrate;
a first structural metallization layer formed over the first insulator layer to provide a first portion of a fixed contact of the MEMS switch;
a first metallization layer formed over the first insulator layer to provide an actuator of the MEMS switch and a first capacitive plate of the MEMS fixed capacitor, wherein the first metallization layer is further formed over the first portion of the fixed contact of the MEMS switch to provide a second portion of the fixed contact of the MEMS switch;
a second insulator layer formed over the first metallization layer and the first insulator layer to provide an actuator insulator of the MEMS switch and a fixed dielectric layer of the MEMS fixed capacitor;
a second metallization layer formed over the first metallization layer and above the actuator insulator and the fixed contact of the MEMS switch to provide a first portion of a movable contact of the MEMS switch, wherein a surface of the first portion of the movable contact, a surface of the actuator insulator, and a surface of the second portion of the fixed contact of the MEMS switch substantially define a clearance between the actuator insulator and the fixed contact of the MEMS switch and the movable contact of the MEMS switch, and wherein the second metallization layer is further formed over the first insulator layer and the second insulator layer to provide a first portion of a second capacitive plate of the MEMS fixed capacitor; and
a cantilever structure layer formed on the second metallization layer to provide a second portion of the movable contact of the MEMS switch and a second portion of the second capacitive plate of the MEMS fixed capacitor.

17. The MEMS switch and the MEMS fixed capacitor formed simultaneously of claim 16 wherein the first insulator layer formed over the substrate includes a plurality of insulator layers.

18. The MEMS switch and the MEMS fixed capacitor formed simultaneously of claim 16 wherein the first structural metallization layer includes a first metallic adhesion layer and a first metallic structural layer.

19. The MEMS switch and the MEMS fixed capacitor formed simultaneously of claim 18 wherein the first metallization layer includes a second metallic adhesion layer and a second metallic structural layer.

20. The MEMS switch and the MEMS fixed capacitor formed simultaneously of claim 19 wherein the second metallization layer includes a third metallic adhesion layer and a third metallic structural layer.

21. The MEMS switch and the MEMS fixed capacitor formed simultaneously of claim 16 further comprising:
a dome layer formed above and around the MEMS switch to provide a dome structure about the MEMS switch, wherein interior walls of the dome structure are distinctly separated from the movable contact, the fixed contact, the actuator, and the actuator insulator of the MEMS switch.

22. The MEMS switch and the MEMS fixed capacitor of claim 21, wherein the dome structure includes evacuation passages.

23. A plurality of micro-electromechanical systems (MEMS) devices comprising:
a substrate having a first insulator layer on a surface of the substrate;
a MEMS switch device including:
a fixed contact including a bump portion formed by a first metallization layer on the first insulator layer and a contact portion formed by a second metallization layer over a portion of the first metallization layer;
an insulated actuator including an actuator portion formed in part by the second metallization layer over the first insulator layer and an insulator portion formed in part by a second insulator layer over the actuator portion; and
a movable contact including a first cantilever portion formed by the second metallization layer and a second cantilever portion formed by a cantilever layer over the first cantilever portion, wherein the movable contact is configured to move towards the insulated actuator upon actuation of the movable contact such that the movable contact comes into contact with the fixed contact; and
a MEMS fixed capacitor including:
a first fixed capacitive plate formed by a first metallization layer on the first insulator layer;
a dielectric layer on the first fixed capacitive plate formed by the second insulator layer; and
a second fixed capacitive plate over the dielectric layer formed by the second metallization layer.

* * * * *

UNITED STATES PATENT AND TRADEMARK OFFICE
CERTIFICATE OF CORRECTION

PATENT NO.         : 8,399,333 B2
APPLICATION NO.    : 13/097989
DATED              : March 19, 2013
INVENTOR(S)        : Kim et al.

Page 1 of 1

It is certified that error appears in the above-identified patent and that said Letters Patent is hereby corrected as shown below:

In the Claims

In claim 13, column 16, line 44, delete the words "a portion"

Signed and Sealed this
Twenty-fifth Day of June, 2013

Teresa Stanek Rea
*Acting Director of the United States Patent and Trademark Office*